United States Patent

Sawicz et al.

[11] Patent Number: 5,889,775
[45] Date of Patent: Mar. 30, 1999

[54] MULTI-STAGE SWITCH

[75] Inventors: Conrad Jan Sawicz, Tustin; Victor Cecil Kemp, Oceanside; Arvind Chimanlal Desai, Mission Viejo, all of Calif.

[73] Assignee: BE Aerospace, Inc., Wellington, Fla.

[21] Appl. No.: 908,288

[22] Filed: Aug. 7, 1997

Related U.S. Application Data

[63] Continuation of Ser. No. 512,142, Aug. 7, 1995, abandoned.

[51] Int. Cl.$^6$ ..................................................... H04Q 3/00
[52] U.S. Cl. ........................... 370/360; 370/388; 379/273; 340/827; 340/825.8
[58] Field of Search ........................... 340/825.8, 825.86; 348/8, 705, 706; 379/271, 272, 273; 455/3.1, 6.3; 244/118.5; 361/748, 761, 795, 788, 792, 796; 370/351, 357, 360, 386, 388

[56] References Cited

U.S. PATENT DOCUMENTS

| | | | |
|---|---|---|---|
| 3,795,771 | 3/1974 | Gundersen et al. | 370/15 |
| 4,037,250 | 7/1977 | McGahan et al. | 348/705 |
| 4,402,008 | 8/1983 | Teralinna | 340/825.8 |
| 4,417,244 | 11/1983 | Melas | 340/825.8 |
| 4,417,245 | 11/1983 | Melas et al. | 340/825.8 |
| 4,428,078 | 1/1984 | Kuo | 455/3 |
| 4,566,007 | 1/1986 | Richards | 340/825.8 |
| 4,584,603 | 4/1986 | Harrison | 358/86 |
| 4,647,980 | 3/1987 | Stevenson et al. | 358/254 |
| 4,774,514 | 9/1988 | Hidebrandt et al. | 340/971 |
| 4,804,956 | 2/1989 | Boxall | 340/825.8 |
| 4,862,161 | 8/1989 | Schomers | 340/825.8 |
| 4,866,515 | 9/1989 | Tagawa et al. | 358/86 |
| 4,897,714 | 1/1990 | Ichise et al. | 358/86 |
| 5,123,015 | 6/1992 | Brady, Jr. et al. | 370/112 |
| 5,259,784 | 11/1993 | Iwatare et al. | 361/788 |
| 5,287,186 | 2/1994 | Takamori | 348/705 |
| 5,339,221 | 8/1994 | Conroy-Wass et al. | 361/796 |
| 5,455,393 | 10/1995 | Ohshima et al. | 361/792 |

FOREIGN PATENT DOCUMENTS

| | | | |
|---|---|---|---|
| 0277014 | 8/1988 | European Pat. Off. | H04N 7/18 |
| 0230280 | 2/1991 | European Pat. Off. | H04N 7/18 |
| 0281293 | 5/1992 | European Pat. Off. | B64D 11/00 |
| 0282183 | 9/1992 | European Pat. Off. | B64D 11/00 |
| 0557058 | 8/1993 | European Pat. Off. | H04N 7/10 |
| 0278717 | 12/1993 | European Pat. Off. | B64D 11/00 |
| 63-219289 | 9/1988 | Japan | H04N 7/16 |
| 3/187636 | 8/1991 | Japan | H04J 1/00 |
| 1296405 | 11/1972 | United Kingdom | H04N 1/04 |
| 1299602 | 12/1972 | United Kingdom | H04Q 9/00 |
| WO 88/04566 | 6/1988 | WIPO | A63F 9/22 |
| WO 90/15508 | 12/1990 | WIPO | H04N 7/173 |
| WO 94/28679 | 12/1994 | WIPO | H04N 7/10 |

OTHER PUBLICATIONS

"Airlines Weigh Benefits, Costs of At–Seat Video," Aviation Week & Space Tech, p. 44, Aug. 15, 1994.
"Plessey Banks on In–Flight Boredom," Electronics, pp. 32–33, Aug. 1989.
IBM Technical Disclosure Bulletin, vol. 33, No. 11, Apr. 1991.
"Digital Switching" .
"Matrix Systems, Switching Modules, Matrices & Systems," 1994 (short form).
Technical Information regarding Video Switch, Wey Elektronik AG.

*Primary Examiner*—Hassan Kizou
*Attorney, Agent, or Firm*—Gardner, Carton & Douglas

[57] ABSTRACT

The present invention provides a multi-stage switch. An input or first stage receives a plurality of information signals. An output or third stage distributes a plurality of information signals. A middle or second stage establishes a plurality of signal paths between the input stage and output stage. The switch includes a routing function which selects the path between the input stage and the output stage. The routing function includes a reallocation function which reallocates existing paths to free paths to avoid signal blocking.

16 Claims, 18 Drawing Sheets

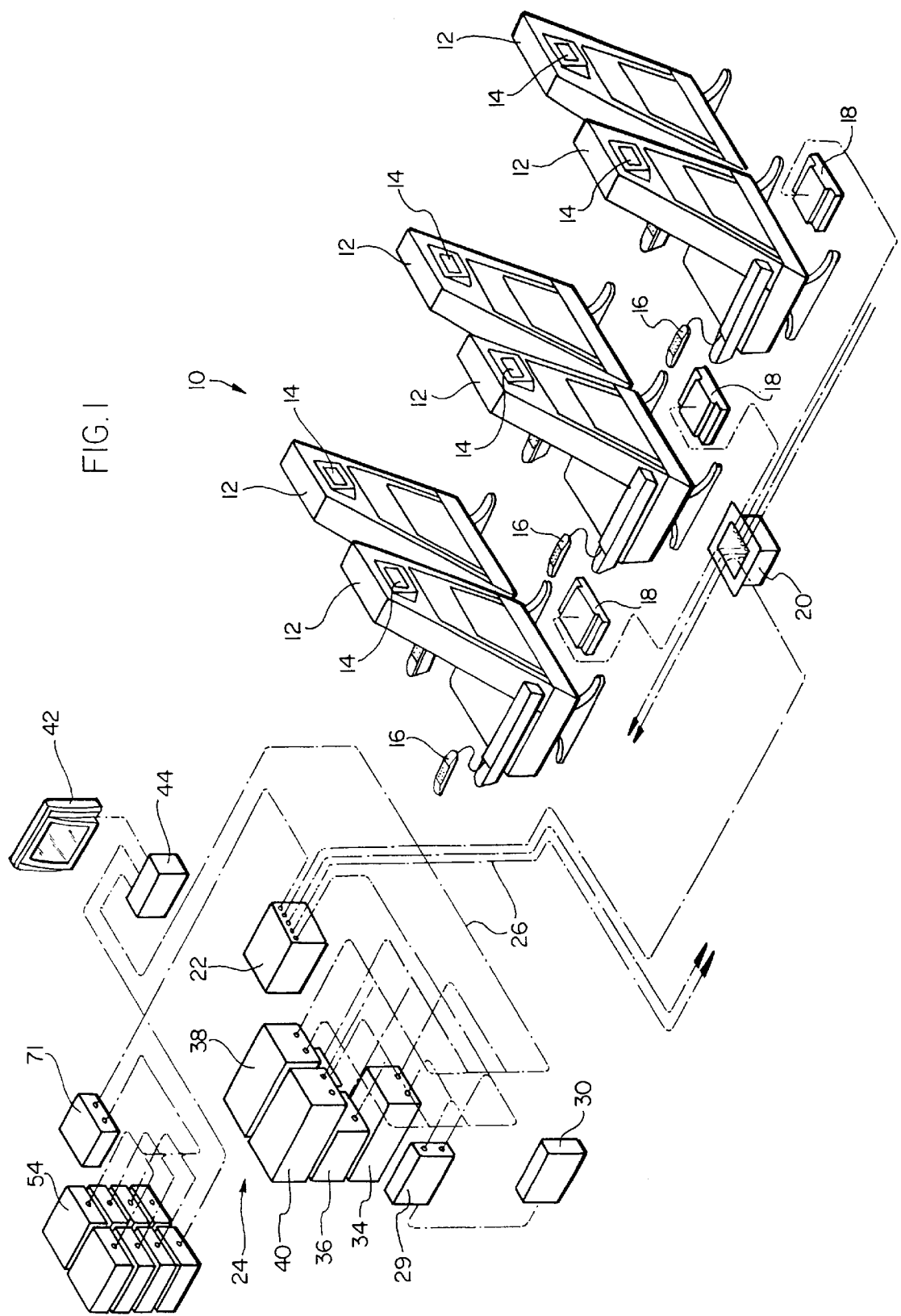

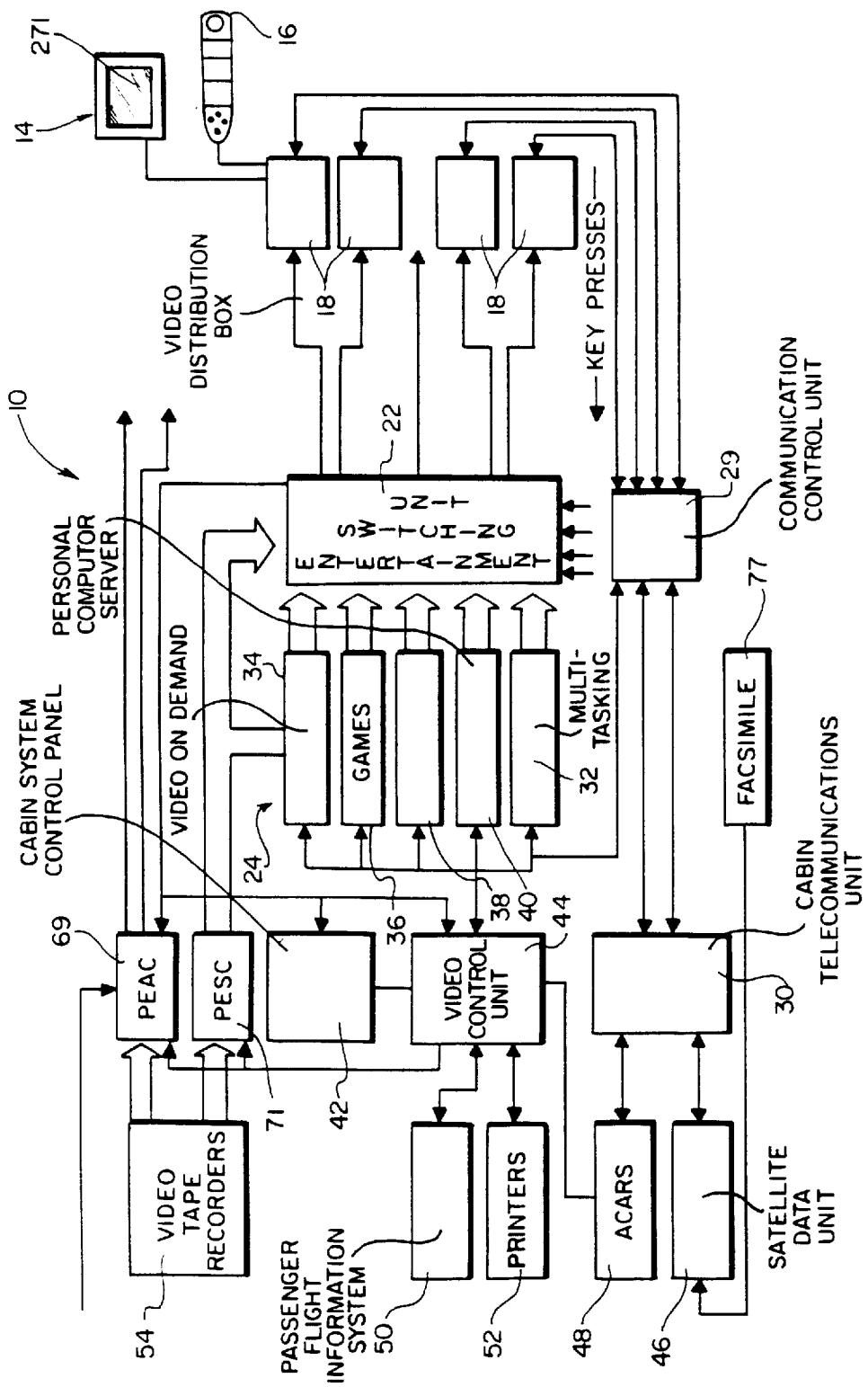

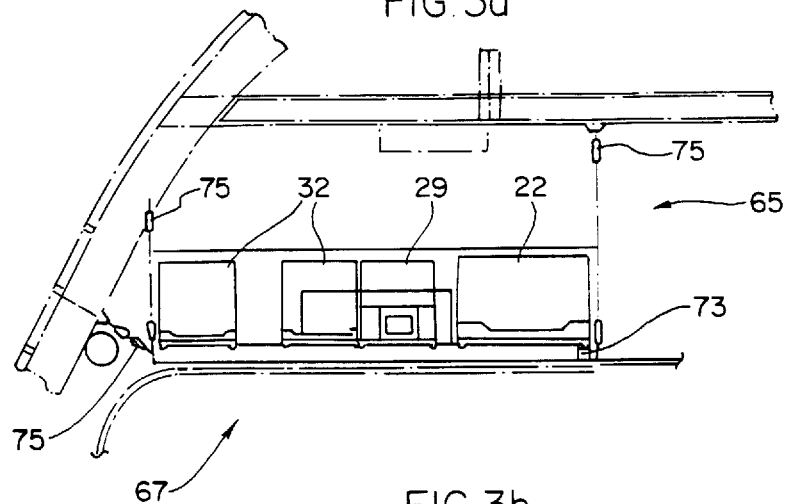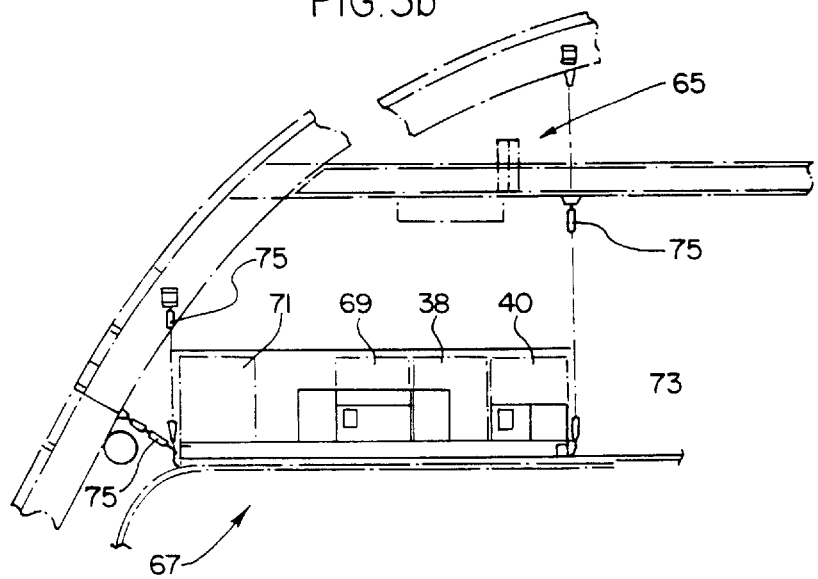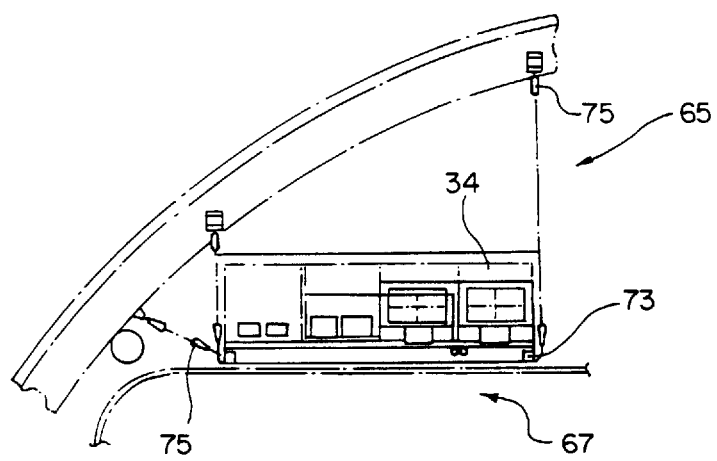

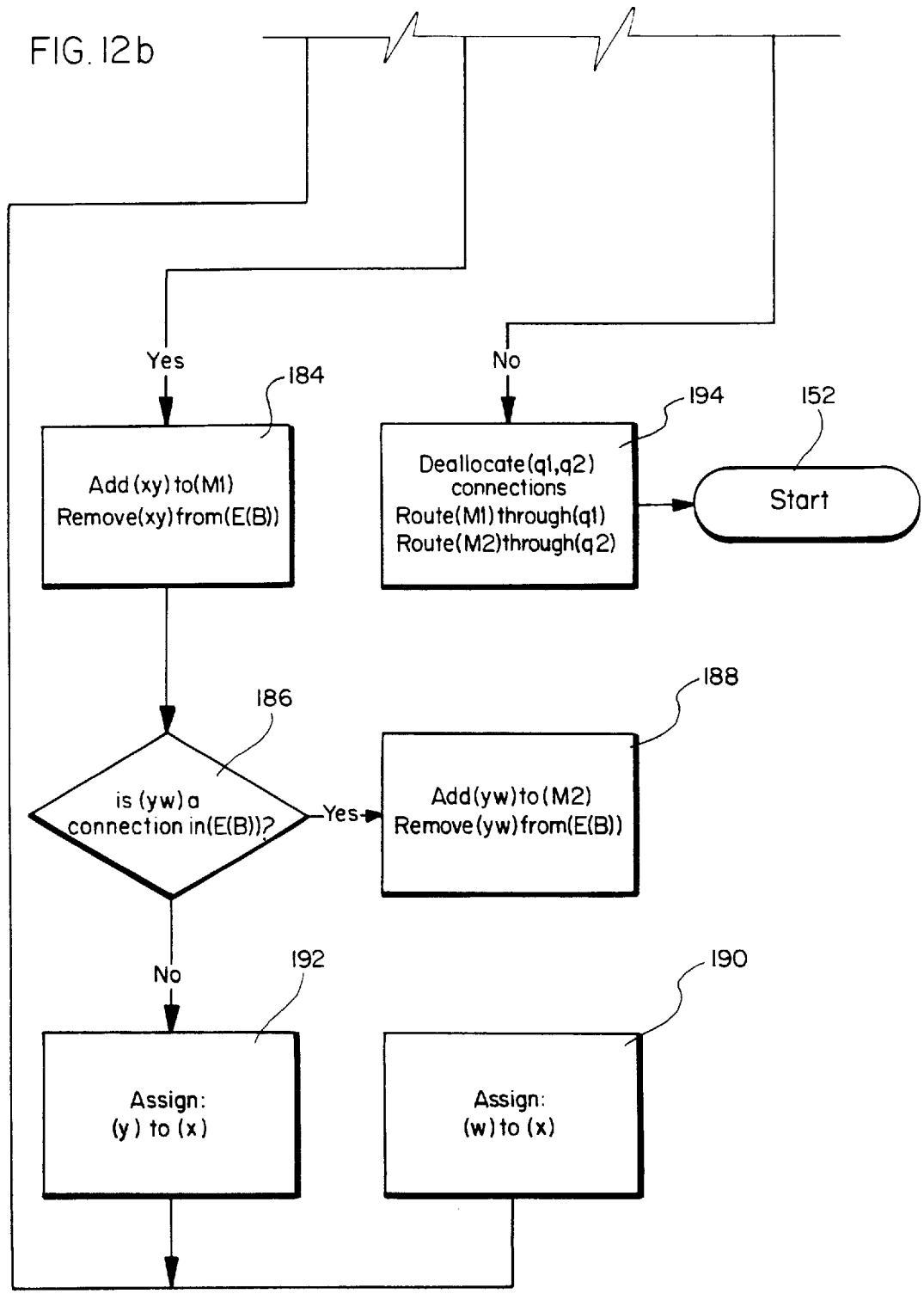

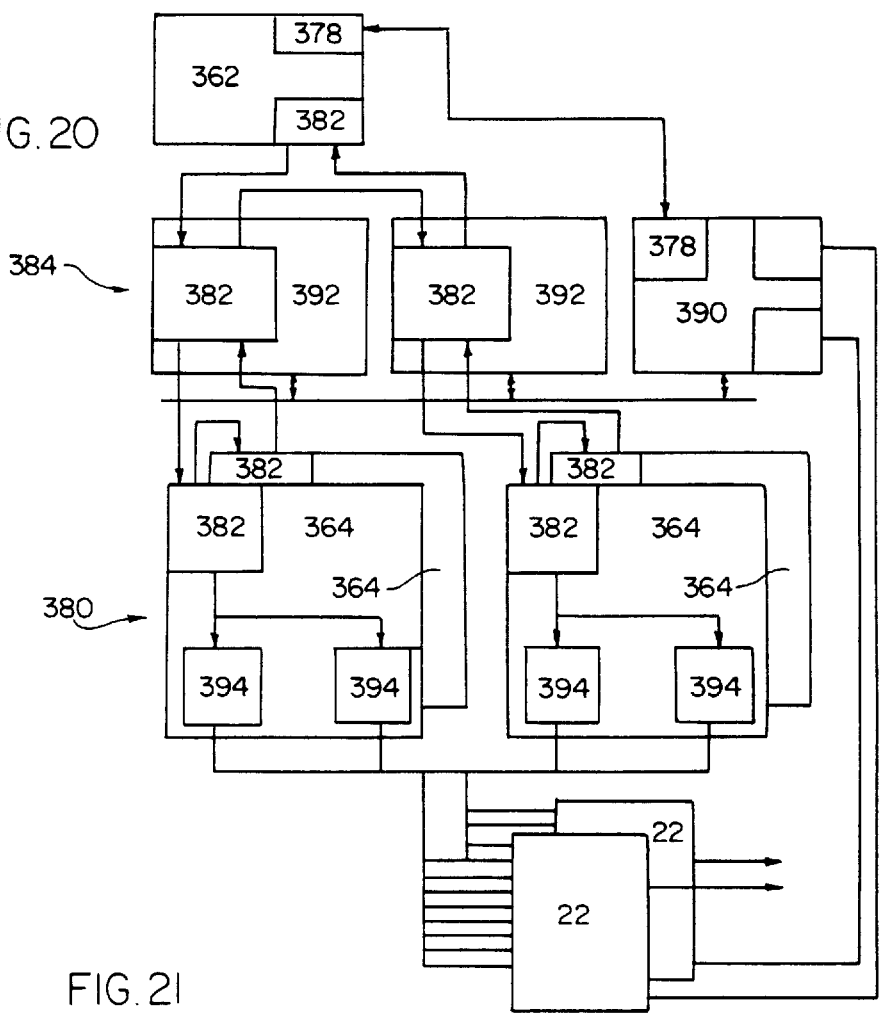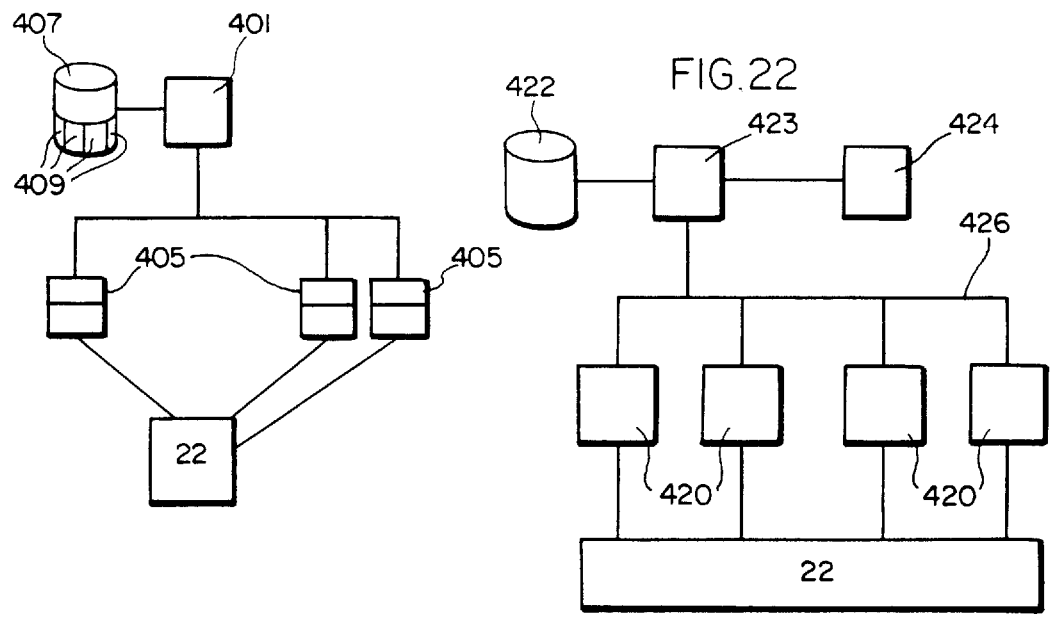

MULTI-STAGE SWITCH

This application is a continuation, of application Ser. No. 08/512,142, filed Aug. 7, 1995, now abandoned.

FIELD OF THE INVENTION

The present invention relates to multi-stage switches, and, in particular, to multi-stage switches for video sources.

BACKGROUND OF THE INVENTION

One type of a multi-stage switch is a three stage switch. Three stage switches have long been used in the telephone industry. Use of three stage switching reduces the number of crosspoints required to construct large numbers of inputs to large numbers of outputs. One embodiment of a three stage switch requires setting up a path from an specific incoming line to an outgoing line or group. In general, multi-stage switches offer alternatives as to which output an input is connected.

Typically, in three stage switches, first stage inputs and third stage outputs are partitioned into subgroups of a given number of crosspoint switches. All center stages in three stage switches provide connections from any first stage to any third stage. In general, the multiple stage structure provides alternative paths through the multi-stage switch from the input to the output.

Blocking of switch connection is said to occur when no open path is available between the first stage and the third stage. It has been shown that if the center stages has overcapacity the switch can be nonblocking. Nonblocking can be derived by first observing that a connection through the center stage requires a switch that has an idle connection to the first stage and an idle connection to the third stage that creates the desired connection. A switch is strictly nonblocking if a desired path from the first stage is always available to the third stage.

Most voice telephone networks accept a certain level of blocking. Accordingly, analysis have been made to evaluate the blocking of telephone three stage switches at given operation levels. Switch capacity can be added to provide excess switch paths to achieve acceptable levels of blocking.

Three stage switches also have been used for video signals. Two major problems affect video three stage switches: blocking and crosstalk. Crosstalk is generally understood to be the interference, or distortion of one information signal caused by another information signal. Crosstalk can be caused by the physical proximity or the strength of signals. Crosstalk and blocking can be easily overcome when space is not a constraint. Blocking can be avoided by increasing the number of switches available so that a path is always available between the input and output. Crosstalk can be avoided in a video switch by increasing the distance between video signals thereby reducing the effect of one signal on another. In the video field, three stage switches tend to be relatively large and heavy because physical space is usually not a constraint.

Such large three stage switches, however, present design problems in applications where space is not readily available such as for use in aircraft and other passenger vehicles. What is therefore needed is a multi-stage switch that reduces or avoids blocking and reduces the crosstalk between video signals while avoiding the size and weight added by the overcapacity of the prior art.

SUMMARY OF THE INVENTION

The present invention provides a multi-stage switch which minimizes blocking and crosstalk while avoiding the size and weight constraints of the prior art. In a preferred embodiment of the present invention, a three stage switch is provided for routing information signals, including video sources, between a head-end of various information sources connected to the first stage, or input, of the switch to multiple terminal end units connected to the third stage, or output. In particular, the present invention avoids blocking so that each terminal end unit can access and use any available information signal. The present invention also reduces the crosstalk of the various information signals, and in particular the video signals, as the signals pass through the switch. The three stage switch allows for flexibility in the choice and number of offered information signals available to the terminal end units connected to the third stage of the switch.

The present invention provides an input, or first stage, of a three stage switch that is connected to various information signals including video signals. The first stage of the switch can preferably be made up of multiple printed circuit boards ("PCB") each having approximately four eight-by-eight crosspoint switches, the eight-by-eight crosspoint switches are generally integrated circuits the inputs of which are connected to the information signals. The outputs of the integrated circuits are connected to the crosspoint, or center stage, of the three stage switch.

Similar to the input in the preferred embodiment, the crosspoint of the three stage switch is a PCB having thirty-two by twenty-eight crosspoint switches. The crosspoint switches of the center stage are also integrated circuits. The input for each crosspoint switch in the second stage is connected to each integrated circuit output of the first stage. In addition, the inputs can be connected to the outputs of a second input stage. The preferred embodiment of the present invention, the center stage has eight thirty-two by twenty-eight crosspoint switches. Each switch has twenty-eight inputs from the first stage and four inputs from the second input stage. The first stage inputs are generally nonbroadcast signals and the second input stage is for broadcast video signals.

The output, or third stage, of the three stage switch of the present invention is generally identical to the first stage. The inputs are connected to the output from each switch in the second stage. In the preferred embodiment, the output is made of seven thirty-two by eight crosspoint switches. Eight inputs are connected to the eight crosspoint switches of the center stage and the remaining inputs are connected to the second input of broadcast signals. The output is connected to a terminal end unit. In an embodiment of the present invention there are a total of 224 terminal end units.

The present invention also includes a routing means that takes selections for a given information source by a terminal end unit and provides a path through the three stage switch to make the desired switch. It is generally understood that for each three stage switch there is a configuration in which each output can be connected to an input without blocking. However, when a given input selection from an output is made one at a time, a path for that selection is not necessarily always available and the connection can be blocked. In the preferred embodiment, the reallocation means examines each path or each output at most once to reallocate the paths within the switch to avoid blocking.

The present invention is particularly suitable for use as a part of an entertainment and service system for use in aircraft and other passenger vehicles which allows for transmission of multiple video sources, at the head-end, to video monitors or terminal end units located at the seats while addressing the drawbacks of the prior art. The present invention allows for switching units which are generally smaller in size and weight and which reduce blocking of and crosstalk between video signals.

BRIEF DESCRIPTION OF THE DRAWINGS

FIG. 1 is a perspective view of an aircraft cabin housing a passenger service and entertainment system made in accordance with the principles of the present invention;

FIG. 2 is a schematic overview of the architecture of the system of FIG. 1;

FIGS. 3a–c are cut-away views of an aircraft cabin which shows an example of an aircraft cabin installed with the system of the present invention;

FIGS. 12a and 12b is a flow chart of the reallocation means of the entertainment switching unit of FIG. 5;

FIG. 20 is a schematic of a video on demand made in accordance with the principles of the present invention;

FIG. 21 is a schematic of a personal computing entertainment server made in accordance with the principles of the present invention; and FIG. 22 is a schematic of a game entertainment server made in accordance with the principles of the present invention;

DETAILED DESCRIPTION OF THE PREFERRED EMBODIMENT

Figure 4:
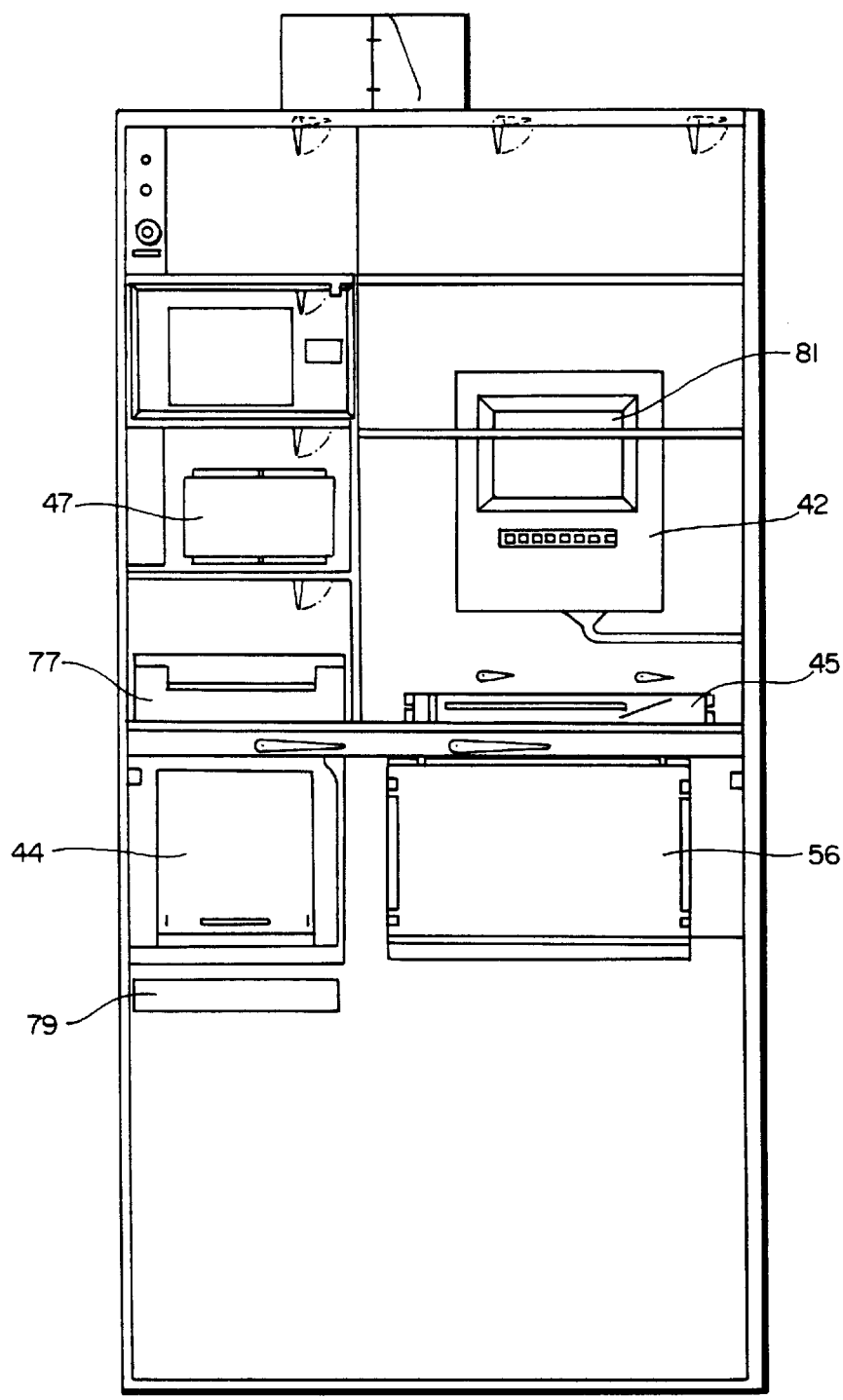
FIG. 4 is an elevated view of the cabin crew interaction area made in accordance with the principles of the present invention.

Referring to FIG. 1, a passenger service and entertainment system, generally indicated by numeral 10, made in accordance with the principles of the present invention is shown. The present invention is preferably installed in a passenger transport vehicle, such as a commercial aircraft. The commercial aircraft includes a plurality of passenger seats 12. Mounted on the rear side of each passenger seat is a compact video display unit ("VDU") 14 for close range viewing by the passenger seated in the seat immediately behind the VDU 14. Alternatively, a compact video display can be provided in the passenger seat armrest or bulkhead. Each passenger seat is additionally equipped in the passenger armrest with a passenger control unit ("PCU") 16 through which the passenger communicates with the system of the present invention.

Passenger seats 12 in aircraft cabins typically are grouped together in double, triple or quad seat groups. For each double, triple or quad seat groups, a video distribution box ("VDB") 18 is provided which connects with the VDUs 14 and the PCUs 16 for the group of seats 12. The VDB 18 for each group of seats 12 is in turn hardwired to a floor distribution box ("FDB") 20. Each VDU 14 and PCU 16 are thus connected via direct, individual, point-to-point star network. In the present invention, all entertainment and data resources are located at an head end in the aircraft cabin.

Referring to FIGS. 1 and 2, a schematic overview of the architecture of the system of FIG. 1 is seen. The head end installation on the aircraft includes an entertainment switching unit ("ESU") 22 which is connected via the direct, individual, point-to-point star network to the FDB 20. The ESU 22 is a switching matrix that connects a passenger to a selected video source. The ESU 22 communicates between the various entertainment servers ("ES") 24, and the passenger seats 12 using baseband frequency division multiplex ("BFDM") transmission technology. The BFDM distributes a baseband video signal to each VDB 18 while permitting up to preferably four audio signals to accompany each video signal. This allows for the system of the present invention to provide with each dedicated video signal a choice of language to the user.

The BFDM outputs from the ESU 22 are collected into cable groups 26 that service a group of seats 12. The cable groups 26 include a dedicated BFDM cable 27 for each seat and ISDN cables 28 for every two seats 12. The cables are preferably coaxial or twisted pair cable. The cable groups 26 are routed under the floor and emerge in the FDB 20, which provides a disconnect and structural interface between the under floor cabling and the VDB 18. Alternatively or in conjunction with the FDB 20, the cable groups 26 can emerge in a sidewall disconnect bracket ("SDB") (not shown) from the aircraft cabin sidewall. In either case, individual cable bundles fan out from the FDB 20 or SDB to the VDB 18 for a seat group.

The head end installation further includes a communications control unit ("CCU") 28. The CCU 29 is interfaced with the VDB 18, the ESU 22, and a cabin telecommunications unit ("CTU") 30. The CCU 29 directs a communication interface between the VDB 18 and the various video services offered in the system. The CCU 29 further provides a telephone interface, including facsimile capabilities, between the passenger seat and the CTU 30. The CTU 30 provides the telecommunications interface for the system.

Further located at the head end are various entertainment servers ("ES") 24. The ESes 24 can include, for example, a multi-tasking entertainment server ("MTES") 32, video on demand ("VOD") 34, a game entertainment server ("GES") 36 for video games such as a Super Nintendo Entertainment Service ("SNES") 38, and personal computing entertainment servers ("PCES") 40. The typical server includes multiple, individual, independent hardware and software platforms to support the applications, a mass storage disk drive unit that stores the supporting data, and a BFDM signal conversion.

The system includes various cabin crew and maintenance crew automation features. The main interface for these features is the cabin systems control panel ("CSCP") 42. The CSCP 42 and accompanying keyboard and touch screen inputs provide user interface with the video control unit ("VCU") 44. The VCU 44 provides an interface with the software of the present invention. The VCU 44 and CSCP 42 provide interface to the various cabin interface features such as the satellite data unit ("SDU") 46, the aircraft communications addressing and reporting system ("ACARS") 48, the passenger flight information systems ("PFIS") 50, and printers 52, as well as other ESes 24 via the CCU 29. The VCU 44 and CSCP 42 further provide interface to the various cabin management features such as point of sale control, inventory control, crew reports and credit card transaction management. The system also provides for interface with various broadcast such as numerous video tape recorders ("VTR") 54, audio entertainment, passenger announcement ("PA"), and video announcement ("VA").

Power is provided to the system by a power distribution unit ("PDU") 56. Each of the ESes 24, as well as the other units are powered directly from the aircraft power supply, and the power is controlled by the PDU 56. The VDB 18 and the VDU 44 receive power directly from and power is controlled by the PDU 56.

Referring now to FIGS. 3a–c, cut-away views of an aircraft cabin are seen which depict an example of an installation of the system of the present invention. The head end installation depicted in FIGS. 3a–c is in the overhead space 65 above the passenger compartment 67. Of course, the present invention contemplates use of any number of head end locations depending on the number of passengers to be served. Additionally, the present invention contemplates head end installations wherever appropriate space and cooling capacity can be provided.

The head end installation depicted in FIGS. 3a–c includes an ESU 22, a CCU 29, a PEAC 69, a PESC 71 and various ESes 24. The ESes 24 include three VODs 34, two MTESes 32, a SNES 38, and a PCES 40. Of course, the present invention contemplates use of any combination of ESes 24.

The various units are secured in an equipment rack 73. Each unit can be easily removed from the rack 73, and a new or different unit can easily be placed in the rack 73. The units are thus referred to as line replaceable units ("LRUs"l). Use of LRUs make maintenance easy as a defective ILRU can simply be removed, replaced and repaired outside the aircraft cabin. Use of LRUs also provides for flexibility in choosing different mixes of ESes 24 for different flights. Finally, use of LRUs provide for easy upgrades as an obsolete LRU can simply be replaced with a new version.

The rack 73 is secured to the frame of the aircraft by several supports 75. The rack 73 is positioned so as not to interfere with the existing mechanical systems present in the aircraft, such as air vents, control cables or passenger cabin ceiling supports.

Referring now to FIG. 4, the cabin crew interaction area is seen. The area includes a CSCP 42 and a VCU 44, a keyboard 45, a printer 47 and a facsimile 77, a power unit 56, and a cooling fan assembly 79. The CSCP 42 includes a full color, active LCD 81. The crew interaction area provides the crew with access to the necessary LRU's to interact with the system of the present invention, as described in detail below.

Entertainment Switching Unit

Figure 5:
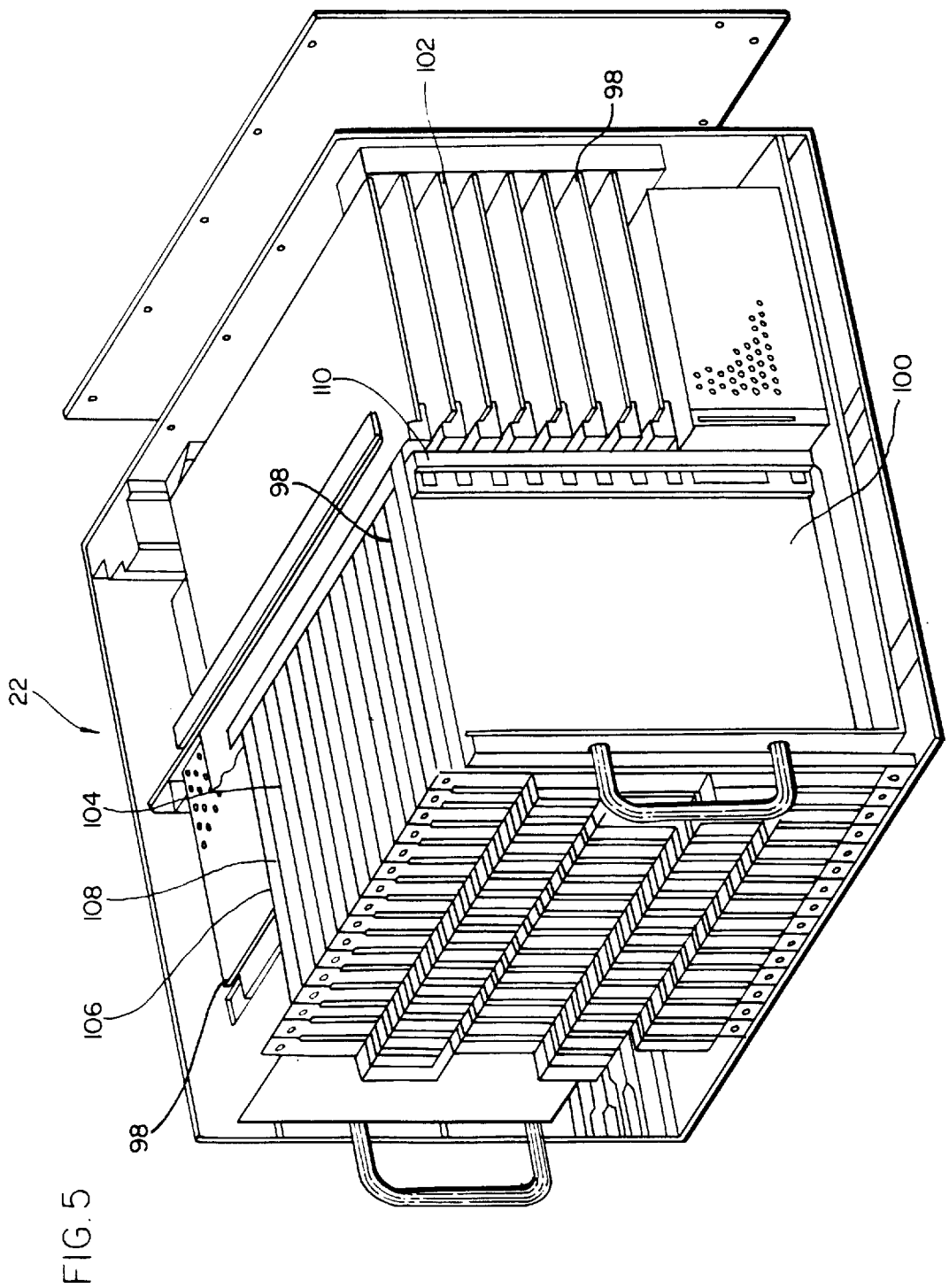
FIG. 5 is a perspective view of an entertainment switching unit made in accordance with the principles of the present invention.

Referring now to FIG. 5, the ESU 22 or entertainment switching unit is seen. The ESU 22 is a multi-bank switch matrix 90 that connects the ESes 24 and other video sources to the aircraft seats 12. In the preferred embodiment described herein, the ESU 22 is capable of connecting up to, for example, 224 inputs to up to 224 passengers seats 12. The present invention contemplates use of a single ESU 22 on board an aircraft as well as use of a plurality of ESUs 22 within the same aircraft cabin, depending on the number of connections required. The present invention further contemplates installation of a plurality of ESUs 22 either at a centralized head-in location in the aircraft cabin or distributed throughout the cabin at head-end locations, depending on the installation and cabling requirements.

The ESU 22 works in conjunction with portions of the CCU 29 to provide the resource distributions switching for the system. The CCU 29 requests the ESU 22 to connect a passenger to a requested entertainment source. The ESU 22 provides local control of the physical switches resident in the ESU 22.

The available resources which are provided to passengers can be divided into two classes: broadcast video ("BV") and non-broadcast video ("NBV"). BV is a single video signal simultaneously broadcast to many video monitors whereas NBV is a single video signal selectively output to video monitors. An example of the former is a passenger announcement or traditional movie broadcasted to all seats, and an example of the latter is a passenger selected video film (VOD), a video game or an interactive menu. The ESU 22 switches those resources which have been requested by the passenger on the PCU 16 to the passenger through the seat group VDB 18.

Figure 6:
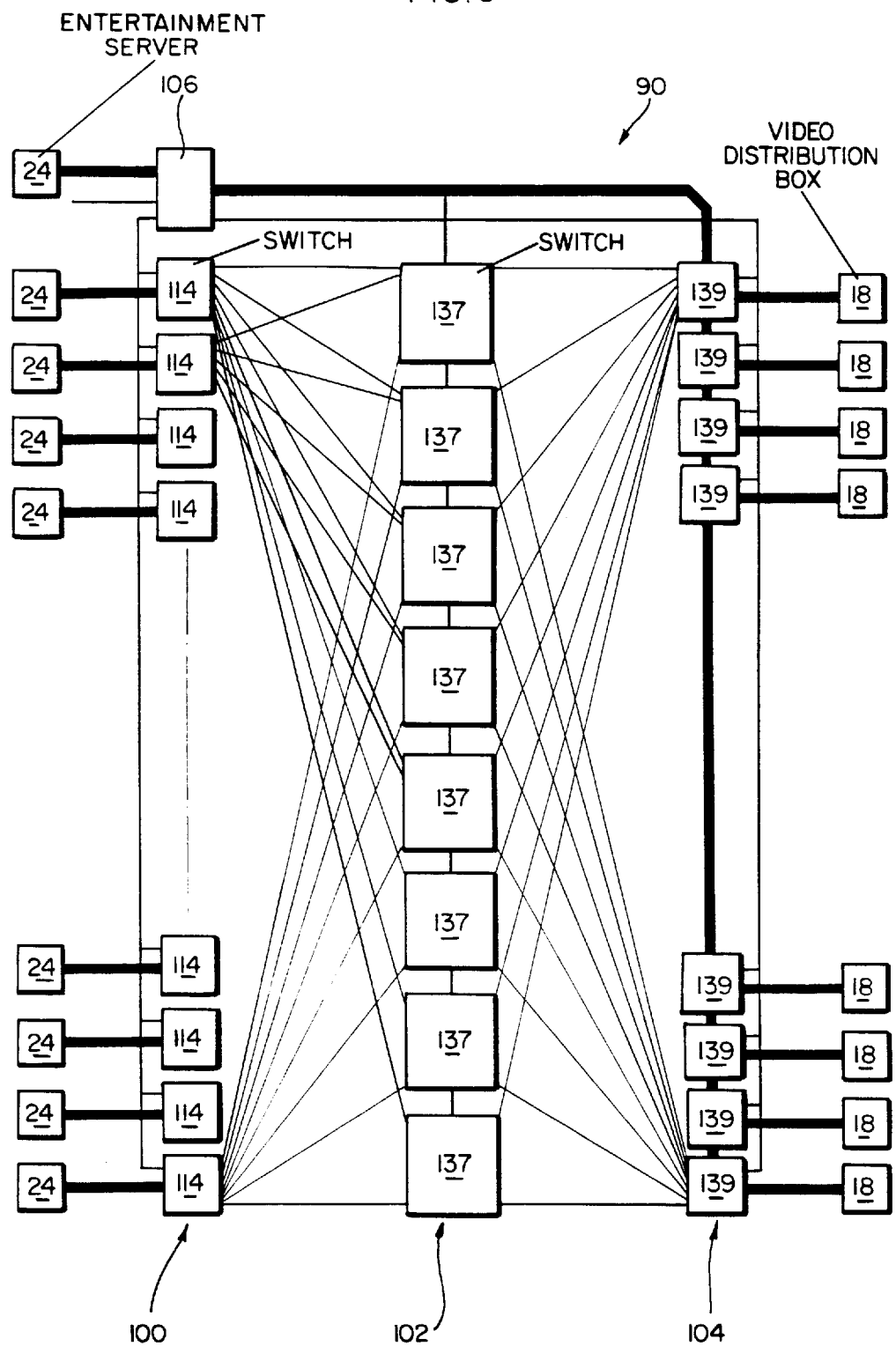
FIG. 6 is schematic of the entertainment switching unit of FIG. 5.

As seen in FIG. 6, the ESU 22 incorporates a large matrix 90 switch utilizing three switch stages implemented on a plurality of printed circuit boards ("PCB") 98: the input or video one stage 100; the center or video two stage 102; and the output or video three stage 104. The NBV inputs are sent to the input or video one stage 100 while the BV inputs are routed to the center or video two stage 102 and output or video three stage 104. Separation of the BV and NBV inputs insures that the BV inputs are not blocked, which could occur if both BV and NBV were routed through all three switch stages.

The ESU 22 is interfaced with the ESes 24 by coaxial cable. The signals are received from the ESes 24 utilizing BFDM or Baseband Frequency Division Multiplex signal format. BFDM maintains the high video and audio quality of full baseband systems while requiring only one coaxial cable for each seat. The BFDM signal format preferably allows four audio channels to be sent with the video signal to allow the passenger up to four choices of languages to accompany the video signal. In a preferred embodiment, the video signal is a National Television Systems Committee ("NTSC")

video signal. The video signal is broadcast at baseband, while the four audio channels are frequency modulated ("FM") at four equally spaced carrier frequencies in preferable the 4–7 MHz band. Total band width of the BFDM signal is therefore preferable about 7 MHz. The ESU 22 output utilizes BFDM signal format and is connected to the VDB 18 by coaxial cables.

In addition to the video one 100, video two 102 and video three stage 104 PCB 98, the ESU 22 architecture includes a Broadcast Video Printed Circuit Board ("B Video PCB") 106, an input/output PCB 108 and a video backplane PCB 110. The input/output PCB 108 contains a microprocessor which includes local memory to store the current physical switch connection routes. The input/output PCB 108 receives the high level routing instructions from the CCU 29 and computes the physical routing instructions for the ESU 22. The ESU 22 returns information to the CCU 29 to update the high level routing map stored in the ESU control subsystem of the CCU 29.

When the input/output buffer PCB 108 receives the high level routing instructions from the CCU 29, a physical switch route is computed based on the routing instructions, the current physical switch connection routes, and an internal routing program. The input/output buffer PCB 108 transmits the computed switch setup data to the video one PCBs 100, video two PCBs 102, and video three PCBs 104.

Figure 7:
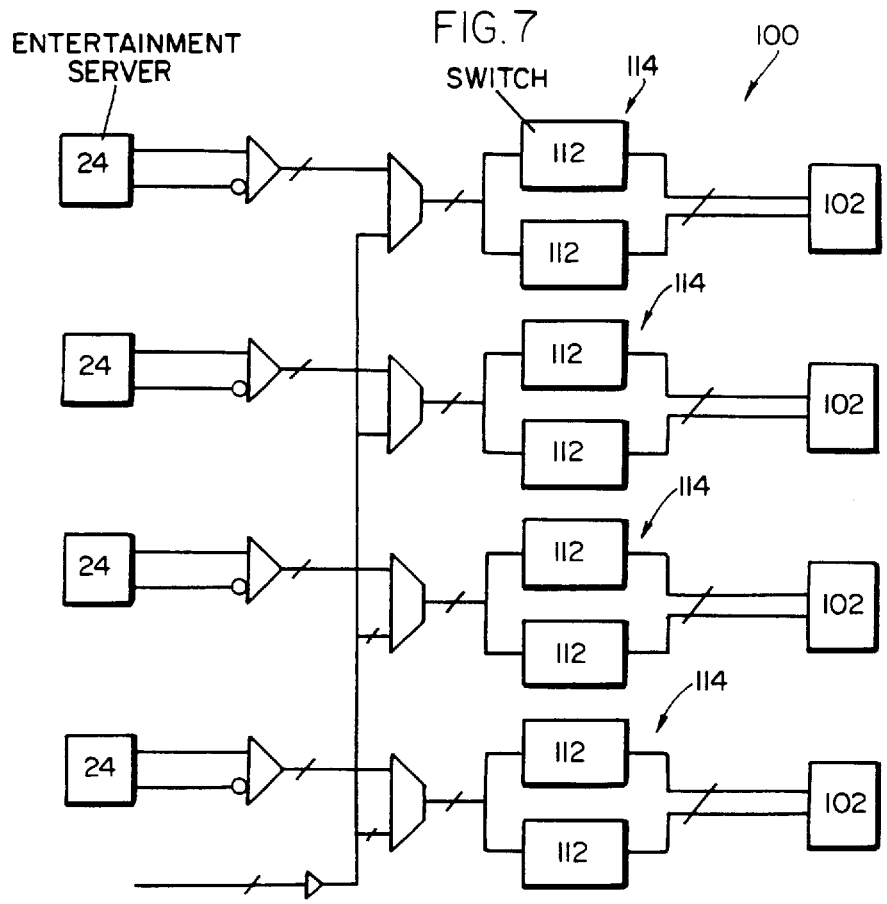
FIG. 7 is a detailed schematic view of the entertainment switching unit of FIG. 5.

As seen in FIG. 7, the video one PCB 100 has a series of 8×4 crosspoint switches 112 which are preferably Maxim MAX458 switches. The MAX458 switches are integrated circuit switches and are used switch between video signals. Two 8×4 switches are combined to form an 8×8 video switch. The video one PCBs 100 contain a total of twenty-eight 8×8 switches which are separated into seven sets of four 8×8 switches. Each 8×8 switch accepts an input from one or more ESes 24, and in general these inputs are NBV inputs. The inputs can be arranged so that each switch has inputs from the same ES 24 or inputs from different ESes 24. The number of inputs from each ES 24 to the ESU 22 can vary depending on system requirements and configuration. In a preferred embodiment, BV signals are not generally input into the video one PCB 100 so that BV is not blocked from the passenger seats 12.

Figure 8:
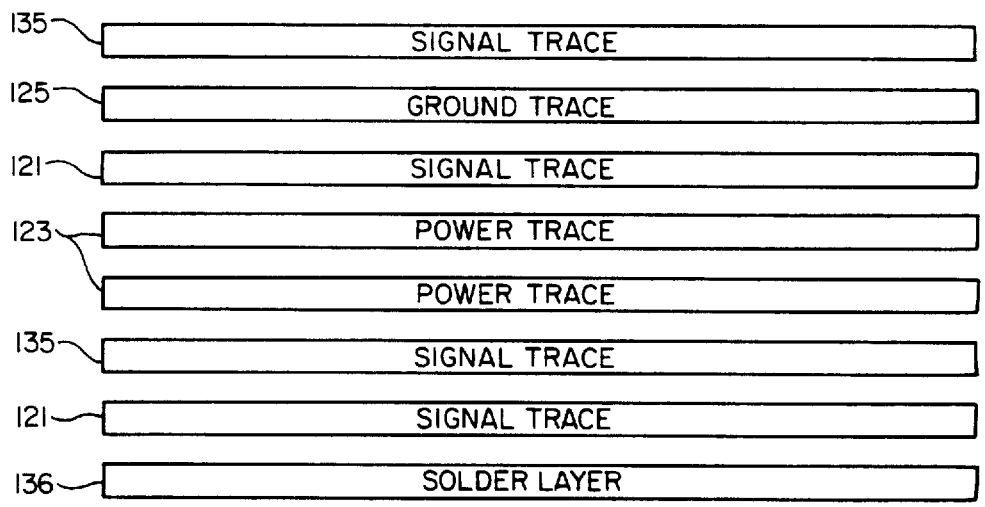
FIG. 8 is a cross sectional view of a printed circuit board of the entertainment switching unit of FIG. 5.

The video one PCB 100 is a multilayer PCB 98, as shown in FIG. 8, thus substantially preventing crosstalk between signals while maintaining low capacitance signal lines to ensure video bandwidth is not sacrificed. The number of layers will depend on the complexity of the circuit, but in the preferred embodiment, there are seven layers and a solder layer 136. In the preferred embodiment, the layer dielectric that has a dielectric constant will be between 4.5 and 5.2. The dielectric layer thickness will be approximately 15 mils. The power traces 123, ground traces 125 and signal traces 135, or planes, will be approximately 1.35 mils thick and a minimum of 6 mils wide. The signal traces of the outside layers 135 will have a capacitance of approximately 1.53 pF/inches, and the signal traces on the inside layers 121 will have a capacitance of approximately 2.92 pF/inch. Analog signal layers will be interleaved by analog power or analog ground ("AGND") layers. Likewise, digital signal layers will be interleaved by digital power or digital ground ("DGND") layers. Signal traces 121 and 135 and ground traces 125 will have an approximate width of 40 mils. Finally, two signal traces 121 and 135 will be separated by approximately 100 mils or more so that the mutual capacitance between the traces 121 and 135 will be approximately 0.25 pF or less.

In general, long analog signal traces 121 and 135 will be separated by AGND traces and long high speed digital traces 121 and 135 will be separated by DGND traces. AGND and DGND will be isolated on the board. Signal and ground will be isolated by 15 mils or more, as space permits. To minimize capacitance, long signal traces 121 and 135 will be on outside layers. To minimize electromagnetic interference ("EMI"), high speed digital signals will be in the internal layers. Grounds of inputs and outputs of crosspoint switches will be isolated up to connectors to minimize crosstalk through ground. Finally, the inverted input of operational amplifier will have at least 15 mils of isolation from ground.

Referring back to FIGS. 5 and 6, the outputs of the 8×8 switches 114 in video one PCB 100 is connected into one side of the video backplane 110. The video backplane 110 provides straight connections through to the device connected at the other end. In the preferred embodiment, the video backplane 110 is connected to the video two PCB 102 which is the center stage of the three stage ESU 22 switch. The arrangement of the video backplane 110 between the video one PCB 100 and video two PCB 102 permits the video one 100 and video two PCB 102 to be orthogonal to one other. Thus, the necessary connections can be made between the two stages.

Figure 9:
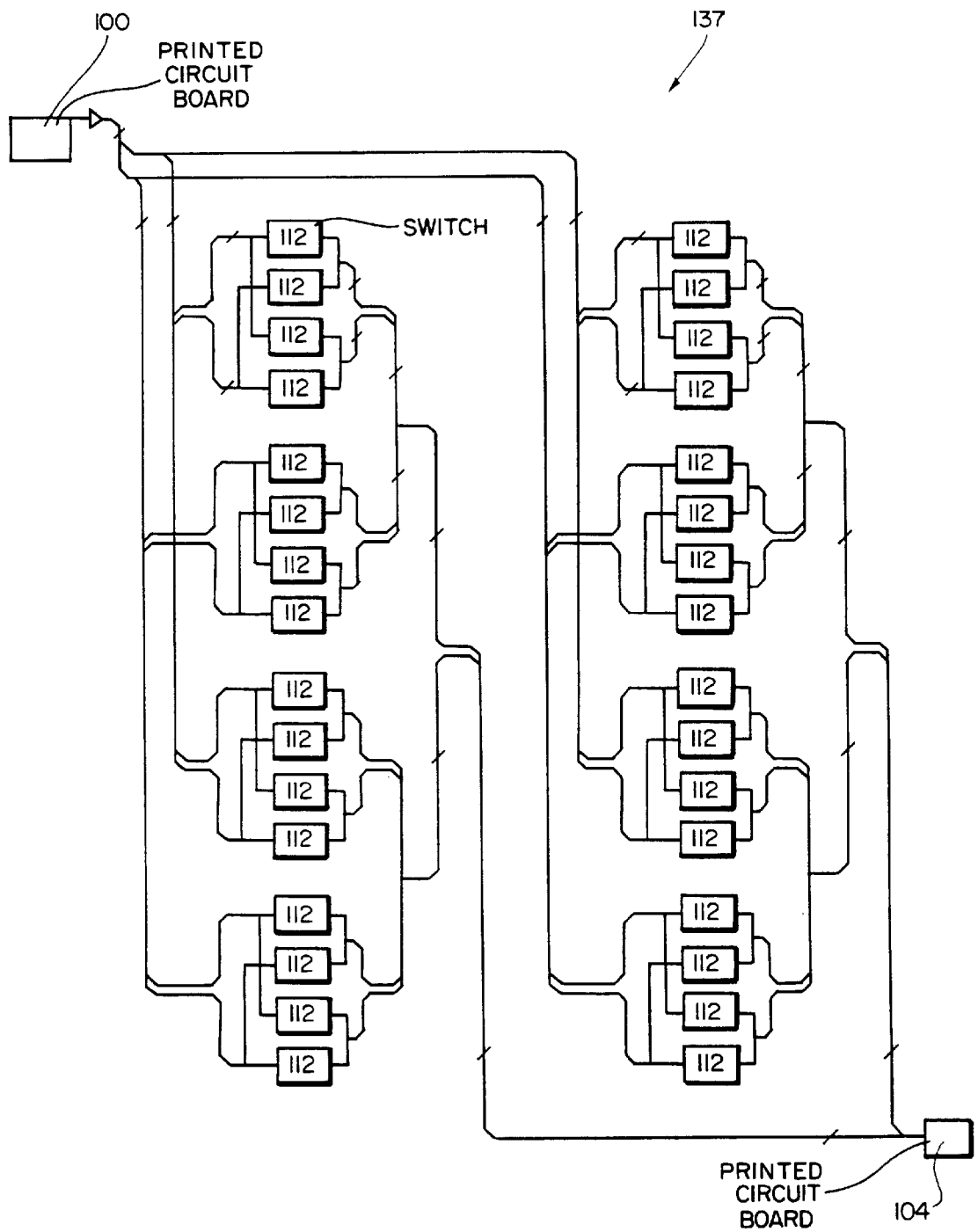
FIG. 9 is a further detailed schematic of the entertainment switching unit of FIG. 5.

As seen in FIG. 9, the video two PCB 102 has eight 32×28 crosspoint switches 137. These 32×28 switches 137 can be made up of two 8×4 switches 112 similar to the switches on the video one PCB 100. For each 32×28 switches 137, one input is from each of the twenty-eight 8×8 switches 114 on the video one PCB 100. The remaining inputs come from the B Video PCB 106 and are BV signals. In another embodiment, when BV signals are not input to the video two PCB 102, 28×28 crosspoint switches 141 can be used. As with the video one PCB 100, the video two PCB 102 is multilayered. In the preferred embodiment, each of the layers is similar to the layers of the video one PCB 100.

The outputs of the video two PCB 102 are connected to the video backplane PCB 110. In the preferred embodiment, the video backplane PCB 110 connected to the output of the second stage switches is the same video backplane PCB 110 as connected to the inputs. In an alternative embodiment, a second video backplane 110 can be used. One video backplane 110 is preferable because it is easier to remove boards from the backplane 110 and to access each board.

Referring back to FIGS. 5 and 6, the outputs of the video two PCB 102 are connected to the video three PCB 104 through the video backplane 110. This arrangement allows the video three PCB 104 to be orthogonal to the video two PCB 102 so that the necessary connections can be made between the two stages. As seen in FIG. 6, the video one PCB 100 and video three PCB 104 are on the same side of the video two PCB 102. Thus, they are also parallel to one another and orthogonal to the video two PCB 102. This arrangement allows easy access to each video PCB 98 and allows the inputs and outputs of each switch to be easily connected to its corresponding PCB 98.

Figure 10:
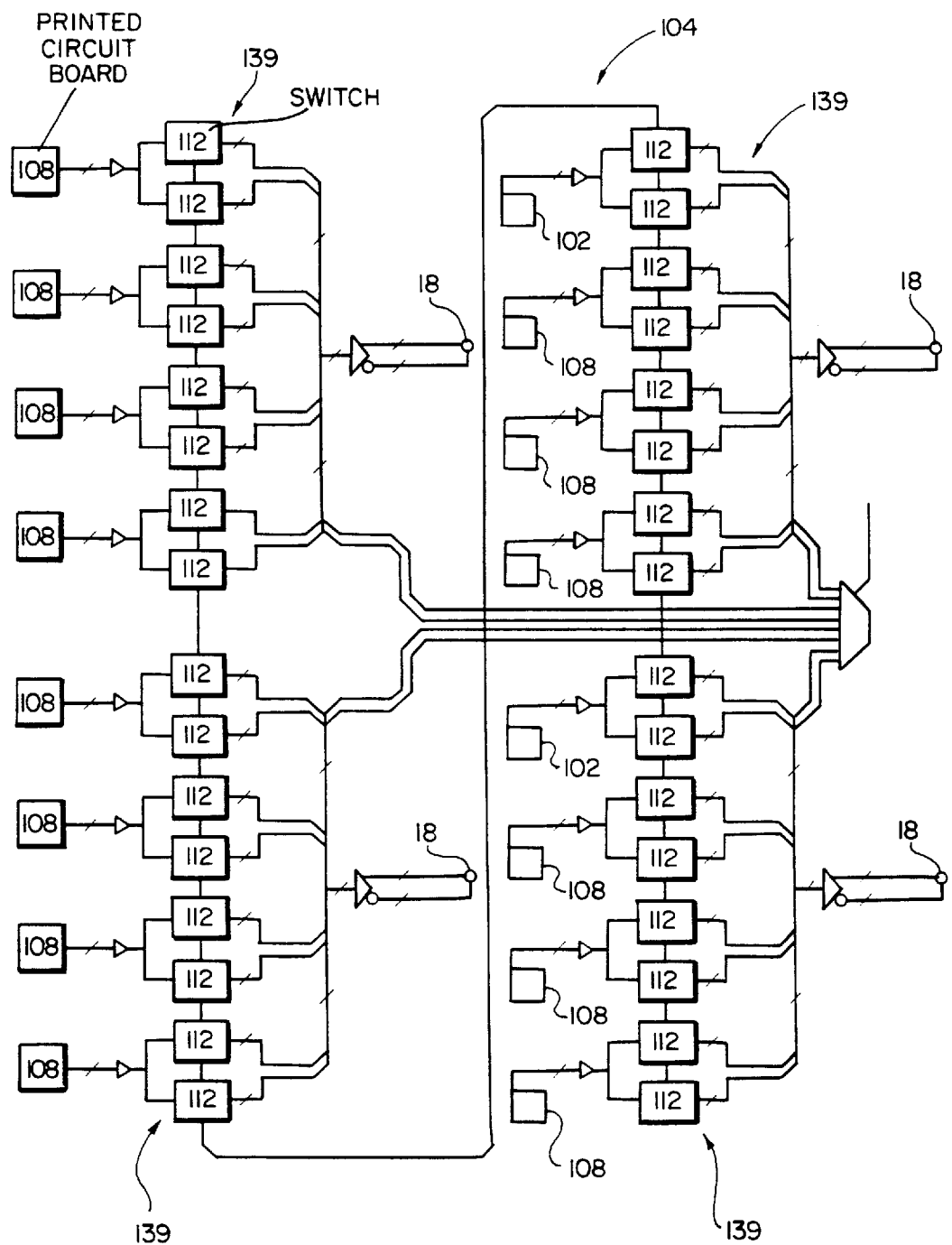
FIG. 10 is a further detailed schematic of the entertainment switching unit of FIG. 5.

Referring now to FIG. 10, the video three PCB 104 contains twenty-eight 32×8 crosspoint switches 139. The twenty-eight switches 139 are divided into seven groups of four switch blocks similar to the video one PCB 100. Each crosspoint switch 139 receives one input from an output from one of the eight 32×28 video two 102 switches. Accordingly, each video three PCB 104 is connected to each video one PCB 100 through the video two PCB 102. The remaining 24 inputs for each crosspoint switch are connected to the B video PCB 106. The 24 BV into the video three PCB 104 and the four BV into each video two PCB 102 provide a total of 28 BV channels input for the use by the passenger seats 12. Alternatively, the video three PCB 104 can be arranged without the BV inputs and would therefore have twenty-eight 8×8 crosspoint switches 114. In this arrangement, the video three PCB 104 and the video one PCB 100 would be identical. Regardless of the number of inputs, the video three PCB 104 has the same general multilayer construction of the video one PCB 100 to lessen the effect of crosstalk between video signals, while at the same time maintaining video signal bandwidth.

The B video PCB 106 receives twenty-eight BV signals corresponding to each BV output to the passenger seats 12. These signals are translated into single ended signals by differential receiver circuits resident on the B video PCB 106. These single ended signals are output to the video two 102 and video three PCB 104s, as described above. The B video PCB 106 also contains testing circuitry for the ESU 22.

The video backplane has a fourteen layer structure to distribute power to the video one 100, video two 102, video three 104 and B video 106 PCBs. The structure also substantially prevents crosstalk between signals. Layers one and fourteen are for pads, surface mount traces and silk-screen; layer two is for −5 volt plane; layers three, seven, eight and twelve are for AGND and DGND planes; layers three through five and nine through eleven are for coax emulation for BV/digital traces; and layer thirteen is for −5 volt analog and +5 volt digital planes. Special trace thickness and spacing between signal traces are used. In the preferred embodiment, the analog planes and traces do not overlap and spacing between traces, grounds, and layers is kept at specific distances to reduce the effects of capacitance. The total thickness is approximately 0.156 inches to make the backplane rigid enough to accept the connectors from the PCBs 98 and to allow the connecting pins to protrude through to the other side.

The ESU 22 includes a microprocessor 143 to achieve the connections between a requested output of an ES 24 and a requested input to a passenger seat. The ESU 22 receives requests from the CCU 29 to connect a requested input to a given output. As explained in detail below, the microprocessor will use a routing means 150 to find a path from the passenger seat connected to the video three PCB 104 to a crosspoint switch in the video two PCB 102 which has an open connection to video one PCB 100 crosspoint switch that has an open connection to the selected entertainment source available. The routing means is a component of the microprocessor to set the paths between an ES 24 and a VDB 24 and controls the crosspoint switches 114 of the video one PCB 100, the crosspoint switches 137 of the video two PCB 102 and the crosspoint switches 139 of the video three PCB 104. If no path between output and input is available, blocking is said to occur.

Blocking is typically found acceptable at a given level for telephone networks. In those situations when blocking is found unacceptable in three stage switches, blocking is reduced by increasing capacity. However, in an application in which space is a premium, such as on board an aircraft, increasing capacity can result in an unacceptable increase in the size of the switching unit. In the switching unit of the present invention, instead of increasing capacity, the ESU 22 contains means for reallocating existing switch paths that will find a path between the output and input so that the requested selection will not be blocked.

According to Beene's Theorem, each three stage switch has at least one non-blocking configuration for each set of input to output selections. A given non-blocking configuration is not always readily available when output to input selections are received by the ESU 22 one at a time. The purpose of the reallocation means 152 is to reroute certain paths through the three stage switch so that the new output to input selection will not be blocked. The reallocation means is a component of the microprocessor to set paths with the routing means 150 between an ES 24 and a VDB 24 and controls the crosspoint switches 114 of the video one PCB 100, the crosspoint switches 137 of the video two PCB 102 and the crosspoint switches 139 of the video three PCB 104. In the preferred embodiment, the reallocation means 152 reconfigures the connections within the three stage switch so that the first available path for the new selection is created and the output to input connection is made. Even though the reallocation means 152 reconfigures the three stage switch, the next output input connection routed to the ESU 22 also can be blocked thereby requiring the reallocation means 152 to reroute some connections to allow the latest output to input selection to be connected. In an alternative embodiment, the reallocation means 152 can include means for packing so that an optimum path is found after each blocking is found thereby reducing the reliance on the reallocation means 152. When a path is rerouted in the ESU 22, the interruption of service between input and output should be kept to a minimum.

Figure 11:
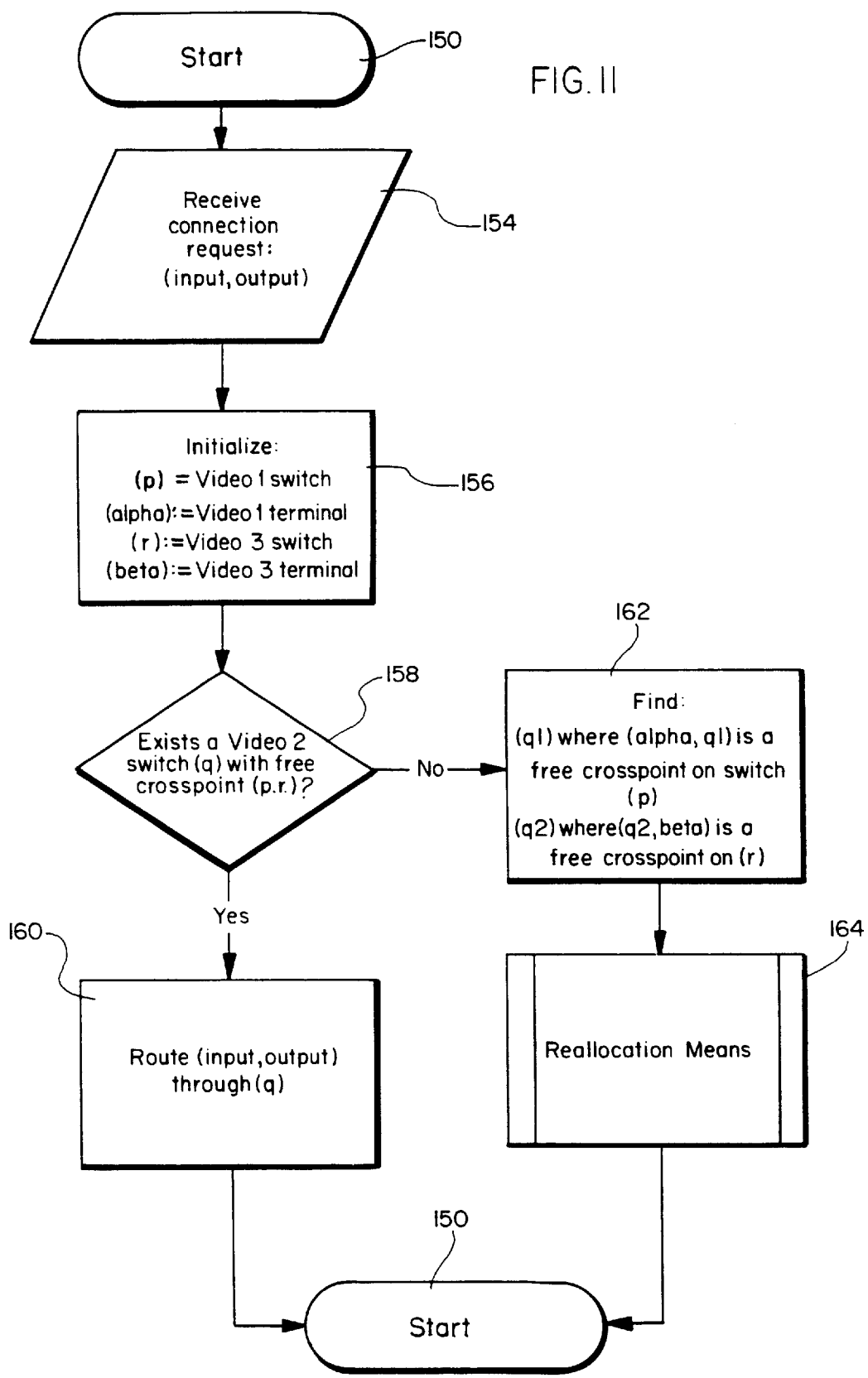
FIG. 11 is a flow chart of the routing means of the entertainment switching unit of FIG. 5.

Turning now to FIG. 11, there is shown a flowchart which shows the implementation of the ESU 22 routing means 150 which routes a passenger seat to a requested ES 24 through the ESU 22 three stage switch. In step 154, the means receives an input number and output number each between 1 and 224 corresponding to the requested ES 24 and passenger seat to be connected. Next, in step 156, the routing means 150 initializes the video one switch 100 number (p) and the video one switch 100 input terminal number ($\alpha$), corresponding to the input number. Step 156 also initializes the video three switch 104 number (r) and the video three switch 104 output terminal number ($\beta$) corresponding to the output number.

In step 158, the ESU 22 routing means 150 checks whether there is a video two switch 102 (q) with a free crosspoint (p,r) available to connect the initialized video one switch 100 (p) and video three switch 104 (r). A free crosspoint (p,r) exists on video two switch 102 (q) if switch (q) is not receiving any input from video one switch 100 (p) and not transmitting any output to video three switch 104 (r). If a video two switch 102 (q) was found in step 158, then in step 160, that switch is used to route the request from step 158.

Figure 12A:
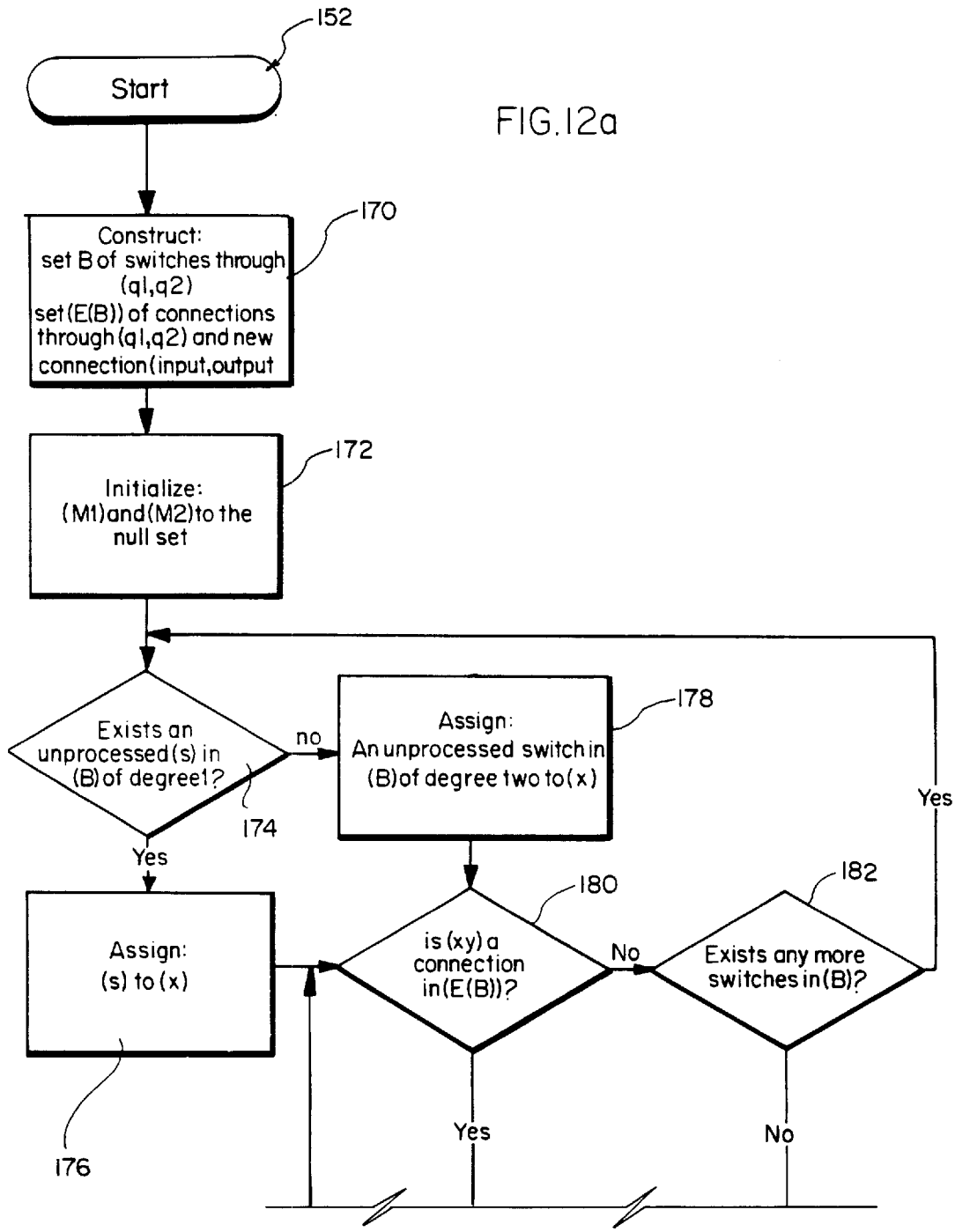

Otherwise in step 162 the routing means 150 finds a video two switch 102 ($q_1$), where ($\alpha,q_1$) is a free crosspoint on video one switch 100 (p), and finds a video two switch 102 ($q_2$), where ($q_2,\beta$) is a free crosspoint on video three switch 104 (r). A free crosspoint (a,b) exists on video one switch 100 (p) if switch (p) is not receiving input from an ES 24 (a) and not transmitting any output to video two switch 102 (b). Similarly, a free crosspoint (c,d) exists on video three switch 104 (r) if switch (r) is not receiving input from video two switch 102 (c) and not transmitting any output to a passenger seat (d). In step 164, described in FIG. 12, the reallocation means 152 reallocates the connections running through the two video two switch 102 ($q_1$, $q_2$) in order to create a non-blocking path for the newly requested connection, as is described in detail below.

As discussed above, FIG. 12 depicts a flowchart describing the steps taken by the reallocation means 152 to reallocate the connections running through the two video two switches 102 ($q_1$, $q_2$). The reallocation means 152 in step 170 constructs a switch set (B) of all video one and video three switches 104 connected through video two switches 102 ($q_1$, $q_2$). In other words, switch set (B) is a set of passenger seats 12 connected between video three and video two and ESes 24 connected between video one and video two. Step 170 also constructs a connection set (E(B)) of connections between switches in switch set (B). Each connection in connection set (E(B)) represents a connection routed through video two switches 102 ($q_1$, $q_2$). The reallocation means 152 also adds a connection to connection set (E(B)) corresponding to the new connection to be made between video one switch 100 (p) and video three switch/ 104 (r).

In steps 170–172, the reallocation means 152 partitions connection set (E(B)) into two subsets of connections such that no two connections in the same subset terminate at the same switch. Such a connection set is called a matching, and the two matchings created in step 172 are designated as ($M_1$) and ($M_2$). The connections in matchings ($M_1$, $M_2$) have the following properties:

(1) Matching ($M_1$) contains no common connections with matching ($M_2$)

(2) All the connections in connection set (E(B)) are found in either matching ($M_1$) or matching ($M_2$), By the definition of a matching given above, either matching can be routed through any empty video two switch 102 (i.e., a video two switch 102 with no connections routed through it).

In step 172, the reallocation means 152 initializes both matchings ($M_1$, $M_2$) to the empty set. In step 174, the reallocation means 152 looks for a switch in switch set (B) which has only one connection in connection set (E(B)) and which has not already been processed by the reallocation means 152. Such a switch is said to be of degree one. If a switch of degree one is found in step 174, the reallocation means 152, in step 176, assigns it to the switch variable (x). Otherwise, step 178 assigns to the switch variable (x) any switch in switch set (B) not already processed by the reallocation means 152.

In step 180, the reallocation means 152 determines if there is an connection in connection set (E(B)) from the switch variable (x) to a switch (y) in switch set (B). Such a connection is designated (xy). If there is no such connection (xy), the reallocation means 152 proceeds to step 182, described below. Otherwise, in step 184 the reallocation means 152 adds connection (xy) to matching ($M_1$) and removes connection (xy) from connection set (E(B)). Then, in step 186, the reallocation means 152 determines if there is a connection (yw) in connection set (E(B)) where (w) is another switch in switch set (B). If there is such an connection (yw), the reallocation means 152, in step 188, adds connection (yw) to matching ($M_2$) and removes connection (yw) from connection set (E(B)). The reallocation means 152, in step 190, assigns switch (w) to switch variable (x). If no connection yw was found in step 186, then in step 192, the reallocation means 152 assigns switch (y) to switch variable (x). When completed with either step 190 or step 192, the reallocation means 152 returns back to step 180.

In step 182, the reallocation means 152 determines if there are unprocessed switches remaining in switch set (B). If so, the reallocation means 152 returns to step 174. If not, the reallocation means 152 has completely constructed matchings ($M_1$, $M_2$). When the reallocation means 152 has completely constructed matchings ($M_1$, $M_2$), the reallocation means 152, in step 194, deallocates the original connections through video two switches 102 ($q_1$, $q_2$). The reallocation routine then, still in step 194, routes the connections in matching ($M_1$) through video two switch 102 ($q_1$) and routes the connections in matching ($M_2$) through video two switch 102 ($q_2$). Because of the nature of a matching, discussed above, this can be done without blocking. Because of the properties of matchings ($M_1$, $M_2$), discussed above, this rerouting maintains all existing connections and adds the newly requested connection without any blocking.

The reallocation means 152 of the present invention will be more clearly understood with reference to the following example, which however is intended to illustrate the reallocation means 152 and is not to be construed to limit the scope of the invention. In the example, the reallocation means 152 is presented in conjunction with a three stage video switch having three (2×2) video one switches 100, two (3×3) video two switches 102 and three (2×2) video three switches 104.

EXAMPLE

Figure 23:
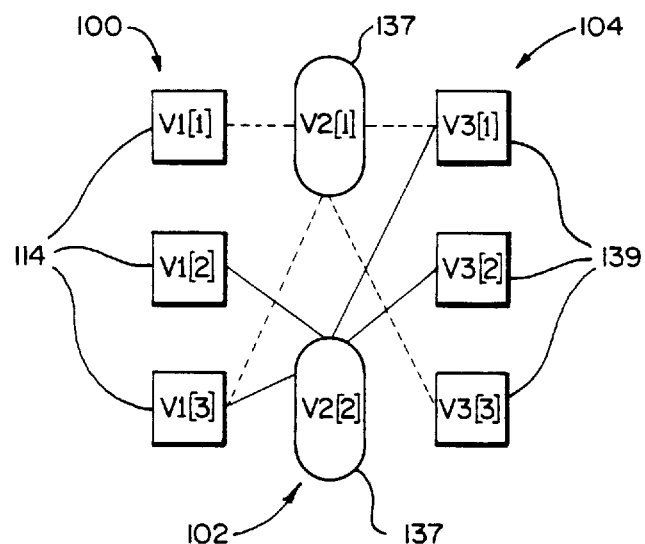
FIG. 23 is a map of the entertainment switching unit with a set of paths routed by the routing means.

As seen in FIG. 23, an example of a three stage video switch is provided with three video one switches 100 (V1[1], V1[2] and V1[3]), two video two switches 102 (V2[1] and V2[2]) and three video three switches 104 (V3[1], V3[2] and V3[3]). Video one switch 100 V1[1] is connected to video three switch 104 V3[1] through video two switch 102 V2[1]. Video one switch 100 V1[3] is connected to video three switch 104 V3[3] through video two switch 102 V2[1]. Video one switch 100 V1[2] is connected to video three switch 104 V3[1] through video two switch 102 V2[2]. Video one switch 100 V1[3] is connected to video three switch 104 V3[2] through video two switch 102 V2[2].

The routing means 150 receives a request to connect an input entering video one switch 100 V1[1] to an output leaving video three switch 104 V3[2]. Because there is an existing connection between video one switch 100 V1[I] and video two switch 102 V2[1], switch V2[1] cannot be used to route the connection. Because there is an existing connection between video two switch 102 V2[2] and video three switch 104 V3[2], video two switch 102 V2[2] cannot be used to route the connection. The three stage switch is therefore blocked.

Figure 24:
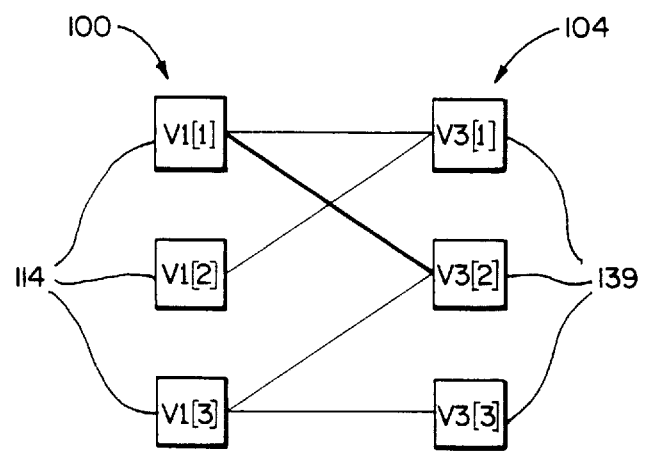
FIG. 24 is a map of the entertainment switching unit with a new path added to FIG. 23.

The reallocation means 152 creates a set of switches and connections without regard to the video two switches 102 involved. This is shown in the following graphical depiction, as seen in FIG. 24 where a heavy line indicates the addition of the new connection.

Figure 25:
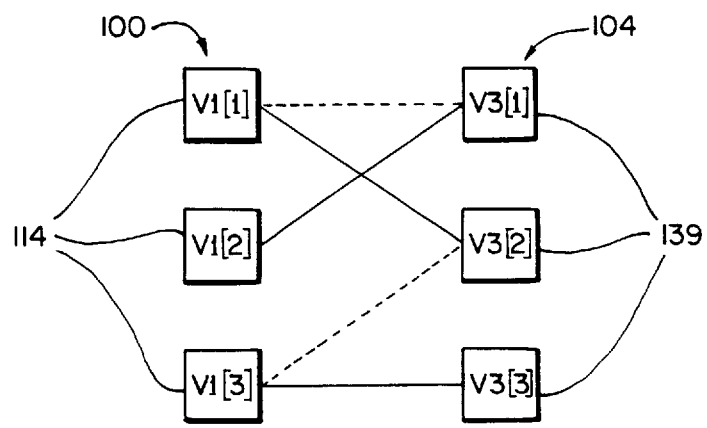
FIG. 25 is a map of the entertainment switching unit with the matchings ($M_1$ $M_2$) created by the reallocation means.

In a preferred embodiment, the reallocation means 152 will process the switches in the following order: V1[2], V3[1], V1[1], V3[2], V1[3], V3[3]. As a result the connections (V1[2], V3[I]), (V1[1], V3[2]) and (V1[3], V3[3]) will be in the first matching and the connections (V1[1], V3[1]) and (V1[3], V3[2]) will be in the second matching as is shown in FIG. 25 where connections in the first matching are shown by solid lines and connections in the second matching are shown by dashed lines.

Figure 26:
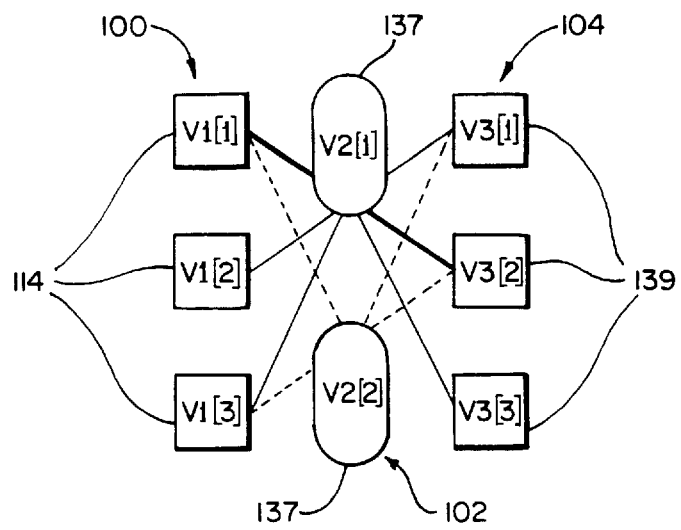
FIG. 26 is a map of the entertainment switching unit including a new path that is not blocked.

As a result of rerouting the connections in the first matching through V2[1] and the connections in the second matching through V2[2], video one switch 100 V1[1] becomes connected to video three switch 104 V3 [2] through video two switch 102 V2 [1]. Thus, the newly requested connection is established. The existing connections are shown in FIG. 26 and rerouted as follows: video one switch 100 V1[2] becomes connected to video three switch 104 V3[1] through video two switch 102 V3[1]. Video one switch 100 V1[3] becomes connected to video three switch 104 V3[3] through video two switch 102 V2[1]. Video one switch 100 V1[1] becomes connected to video three switch 104 V3[1] through video two switch 102 V2[2]. Video one switch 100 V1[3] becomes connected to video three switch 104 V3[2] through video two switch 102 V2[2].

The local memory stores the configuration of the ESU 22. In addition, the memory stores a dynamic table of the output to input connections and routing paths. The dynamic table will be updated after each new connection is made for an output to input selection including a connection made according to the reallocation means 152. The dynamic table can be used to reconfigure the ESU 22 in the event that it fails to maintain its connections for any reason. Thus, the passenger seats 12 can reconnect to the previously selected entertainment source and can resume service from where it was interrupted.

Communications Control Unit

Figure 13:
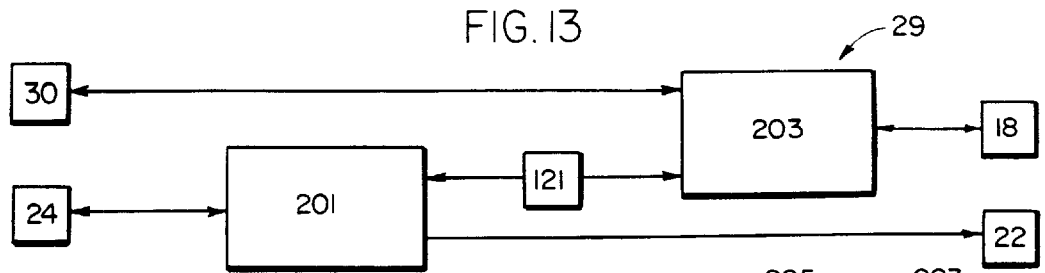
FIG. 13 is a schematic overview of a communications control unit made in accordance with the principles of the present invention.
Figure 14:
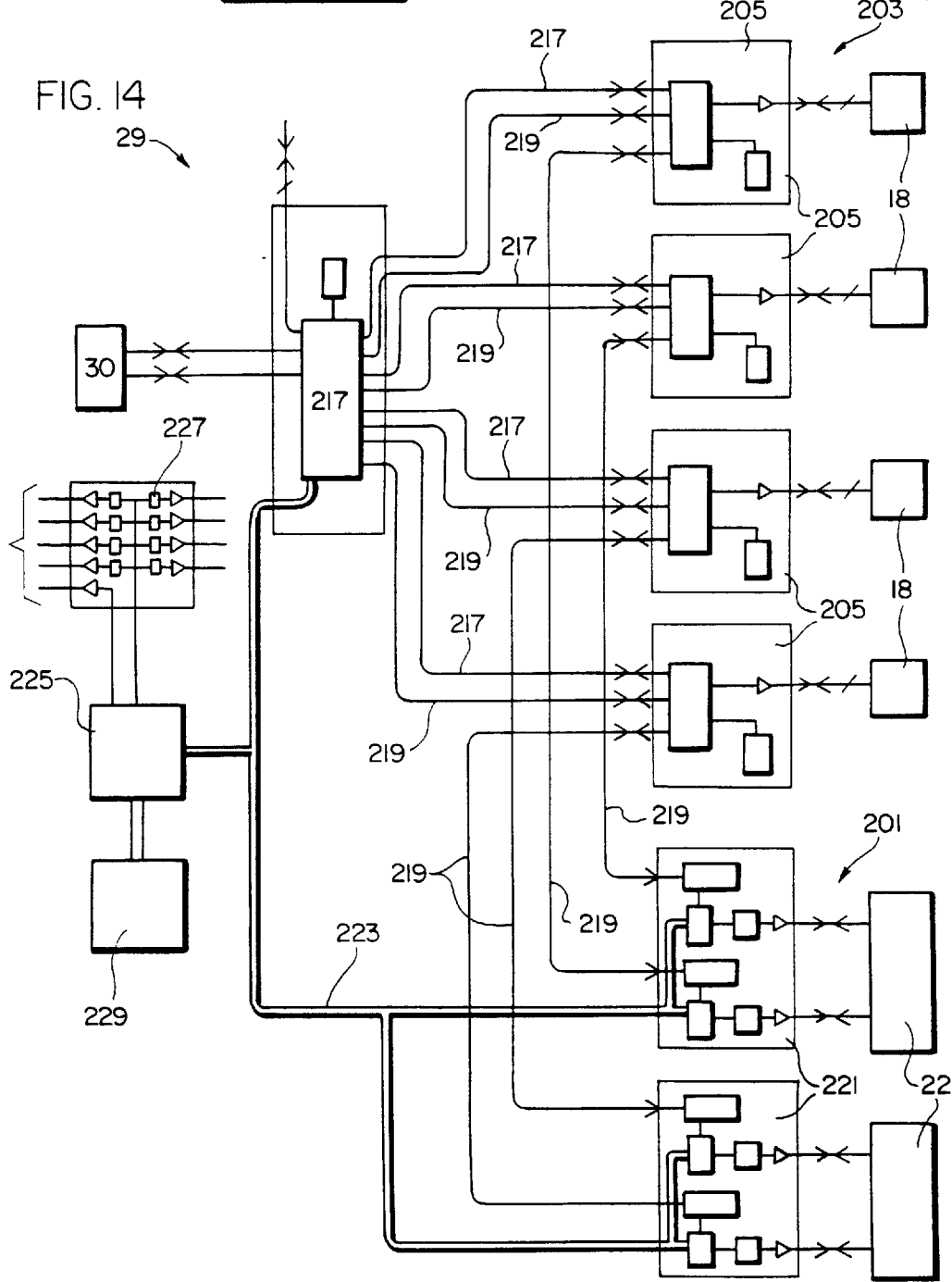
FIG. 14 is a detailed schematic of the communications control unit of FIG. 13.

Referring now to FIGS. 13 and 14, the CCU 29 or Communications Control Unit is described in detail. FIG. 13 is a block overview of the CCU 29 in accordance with the principles of the present invention. The CCU 29 manages the selection and allocation of the system resources. The CCU 29 controls the routing of data, BFDM signals, and voice information within the system. The CCU 29 will determine entertainment resource status and allocate the various resources on ESes 24 to the passenger seats 12 requesting such ESes 24 when the resources are available. Once a connection is made between a passenger seat and a selected ES 24, the CCU 29 will route keypress information to the appropriate ES 24. In addition, the CCU 29 will route keypress information to the BV 94 services available on the system. In the preferred embodiment, communications between the CCU 29 and the ES 24 can be provided for example over an ethernet bus.

The CCU 29 is divided into two subsystems: the data and resource routing subsystem, referred to as the ESU control subsystem 201, and the telephone subsystem 203. While the ESU control subsystem 201 and telephone subsystem 203 are both contained within the CCU 29, the two subsystems are partitioned to continue to function if the other subsystem fails, which is known as fault independent.

The ESU control subsystem 201 provides high level routing instructions to the ESU 22. The telephone subsystem 203 provides telephone linking between the passenger seats 12 and cabin telecommunications unit ("CTU") 30. In a preferred embodiment, the CTU 30 is a standard ARINC 746 airline telecommunications unit. Embodied in the unit is a CEPT/E1 interface which provides the interface between the CCU and the CTU. Data and telephone signals are carried on an Integrated Services Digital Network ("ISDN") cable 28 between the CTU 30 and the VDB 18. ISDN cabling is co-bundled with the BFDM cabling to form a datapath between the CCU 29 and the VDB 18. Each ISDN cable 28 can service up to two seats 12.

All of the passenger services are controlled through the PCU 16 located at the passenger seat. All keypress information input into the PCU 16 and all telephone keypress information is received by the telephone subsystem 203 of the CCU 29. The telephone subsystem 203 monitors and identifies keypress codes from the passenger seat. If a telephone or facsimile 77 code is identified, the telephone subsystem 203 receives the voice and data signals and interfaces the information to the CTU 30. The telephone subsystem 203 includes digital multiplexing card 207 which receives all ISDN B channel voice signals from the VDBs 18. The digital multiplexing card 207 multiplexes the voice signal to the CTU 30. The CTU 30 interfaces with an air-to-ground telecommunications link. In a preferred embodiment, the air-to-ground telecommunications link is a satellite data unit ("SDU") 46 that provides the interface between the telephone subsystem 203 and publicly available telephone networks. The SDU 46 in an aircraft uses a satellite to provide the connection between the telephone subsystem 203 and the public telephone networks.

In the preferred embodiment, the telephone subsystem 203 also includes microprocessor 225, which can be a 68331 Motorola microprocessor, to provide the various functions for the CCU 29. The telephone subsystem 203 receives all communications from the VDB 18 and allocates the keypress information between the CCU 29 and the ESU 22 subsystem using bi-directional communication units. The telephone subsystem 203 uses software to allocate keypress data and to establish control and terminate telecommunications.

If the telephone subsystem 203 identifies the keypress information from the PCU 16 as nontelephonic, it routes this keypress information to the ESU control subsystem 201. The ESU control subsystem 201 interprets the keypress information routed to it, routes the keypress information to the appropriate ESes 24, and provides requests for switching directions based on the keypress information to the ESU 22.

The CCU 29 includes a configuration map of which ES 24 is connected to which passenger seat. The configuration map is stored in the memory of the CCU 29 and is used to allocate the various resources between the ESes 24 and the passenger seats 12. In addition, the CCU 29 has built-in testing equipment to monitor the functions of the unit. It also provides the PA and VA facilities for the system. The PA/VA are hardwired through the CCU 29 to ensure that the PA/VA are sent to the passenger seats 12 every time they are activated. In the preferred embodiment, the PA/VA is activated on the line by having the current go to ground. When PA/VA is activated the connection between the ESes 24 and passenger seats 12 is maintained and the service is paused so that the service can resume where the service was interrupted when the PA/VA is completed. Finally, the CCU 29 receives codes, and in turn downloads the codes to various internal processors of the CCU 29 and all seat components (VDB, PCU, VDU).

Referring to FIG. 14, the CCU 29 receives keypress data from the passenger seats 12 through the VDB 18 on an ISDN connection 205. The ISDN connection 205 uses two ISDN B channels 217 and one ISDN D channel 219 to communicate the voice and keypress data between the terminal end unit and the CCU 29. The two B channels 217 are used for the voice channels and the D channel is used for the control information, or keypress data. The ISDN data is received by an ISDN card within the CCU 29 which separates the B channels 217 and the D channels 219 and multiplexes the voice data to the telephone subsystem 203 of the CCU 29. Similarly, the ISDN card multiplexes the keypress data to the ESU control subsystem 201 of the CCU 29.

The ESU control subsystem 201 consists of two identical switch control cards 221 which receive the multiplex D channel information from the ISDN card. In the preferred embodiment, the switch control cards 221 use Motorola 68331 microprocessors. The switch control cards 221 de-multiplexes the keypress information and allocates this information to the appropriate ESes 24. One output of each switch control cards 221 is connected to the ESU 22, which provides a BFDM connection between a passenger seat and the selected ES 24. Another output of the switch control cards 221 is to a VME backplane 223 which connects to the central processor unit (CPU) of the CCU 29. In the preferred embodiment, the CPU is a Motorola 68040 processor. The communication between the CCU 29 and the various ESes 24 requires a high bandwidth to communicate network signals to the ESes 24. In the preferred embodiment, the CPU communicates with the various ESes 24 over an eight port ethernet bus 227 connection. The CCU 29 communicates with the ESes 24 over the ethernet to allocate the resources.

In the preferred embodiment, the CCU 29 communicates with the ESU 22 over a RS485 channel connection. The CCU 29 activates the ES 24 requested by the passenger seat so that the ESU 22 can provide a BFDM path through the three stage switch between the passenger seat and the requested ES 24. The memory within the CCU 29 will hold the configuration of what passenger seat is using what ES 24. Thus, the CCU 29 determines what ESes 24 may be allocated to a passenger seat when it requests a certain service.

The CCU 29 and the ESU 22 function together in operation to allocate and route resource connections between the ESes 24 and the passenger seats 12. A passenger seat will make a request for a particular entertainment source using keypress data. The keypress data will be routed through the telephone subsystem 203 of the CCU 29 to the switch control cards 221 of the ESU control subsystem 201. The switch control cards 221 will communicate through the CCU's CPU to the requested ES 24. Alternatively, one CCU 29 can control a plurality of ESes 24. In the preferred embodiment, this communication is over the VME backplane 223. The CPU will determine whether the requested ES 24 is available by examining its memory. If the requested ES 24 is available, the CPU communicates with the requested ES 24 using a ethernet connection so that the ES 24 can be activated for the requesting passenger seat.

Simultaneously, the switch control cards 221 communicates with the ESU 22. The switch control cards 221 notifies the ESU 22 which passenger seat is requesting which ES 24. The ESU 22 provides the connection between the output on the video three PCB 104 for the passenger seat to an input on the video one PCB 100 that has an open port to the selected ES 24 using the routing means 150. As described above, the connection is made using a crosspoint switch on the video two PCB 102 that has an open switch between the output and input. If no crosspoint switch can make the required connection, meaning the connection is blocked, the ESU 22 uses the reallocation means 152 to determine a path that is not blocked.

Once a connection is created, keypress data between the passenger seat and the ES 24 is sent through the CCU 29 and the ESU 22. In the event that a passenger seat sends keypress data not intended for the selected ES 24, the CCU 29 will send that keypress data to the appropriate destination. For example, a passenger could be requesting a new ES 24.

If no connection can be made between the passenger seat and the desired ES 24 because the resource is not available, the CCU 29 may queue the passenger seats until the selected ES 24 has the necessary resources for the connection. The queue can be arranged as a first come first served queue whereby the next passenger seat in the queue receives the next available resource of the requested ES 24. In an alternative preferred embodiment, the queue can be arranged as a dynamic queue wherein a passenger seat is inserted with the queue according to its class. For example, in an aircraft, a first class seat requesting a given ES 24 can be inserted into the queue above a business class seat or coach class seat. Multiple degrees of priority can be used.

Video Distribution Box

Figure 15:
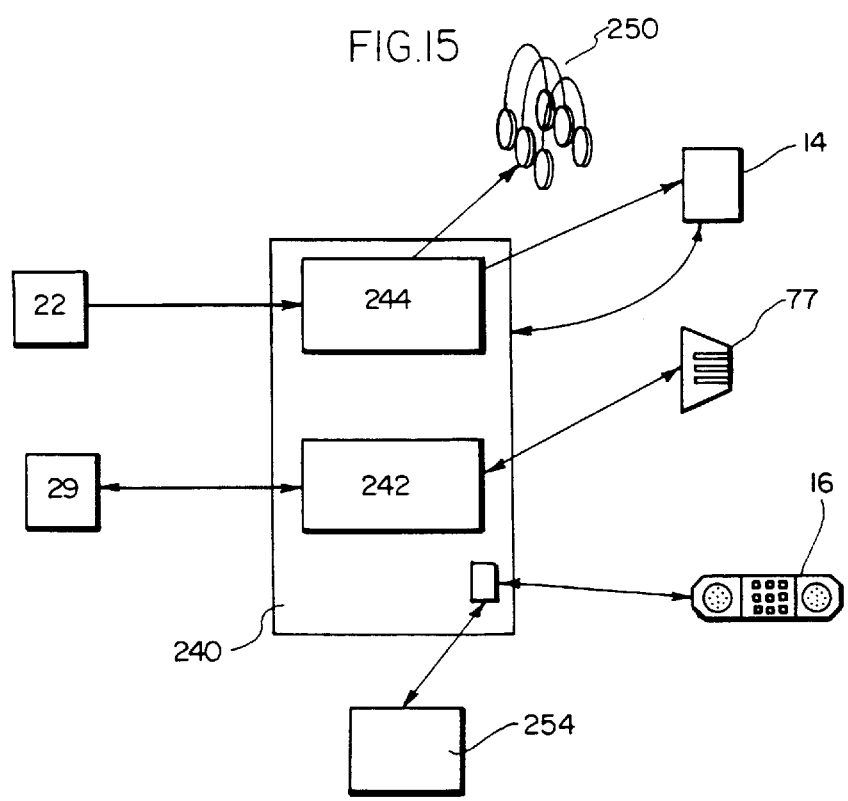
FIG. 15 is a context diagram of a video distribution box made in accordance with the principles of the present invention.

Referring now to FIG. 15, the VDB 18 or Video Distribution Box is described in detail. The VDB 18 distributes the video and audio signals to two, three or four passenger seats 12 depending on the passenger seat configuration. The VDB 18 interfaces directly at the head-end with the ESU 22 and the CCU 29, and at the seat to the PCUs 16 and the VDUs 14. The VDB 18 is connected to the ESU 22 by coaxial cable, with one dedicated coaxial cable per passenger seat. Signals sent from the ESU 22 to the VDB 18 utilize BFDM format. The VDB 18 is connected to the CCU 29 by ISDN cabling co-bundled with the BFDM cabling. Signals sent from the VDB 18 to the CCU 29 utilize ISDN format. The VDB 18 consist of a main circuit board 240, a telephone board 242, and a demodulator board 244.

The main circuit board 240 includes a micro processor to monitor and control the functions within the VDB 18. The power supply provides power to the VDUs 14 and the PCUs 16. The demodulator board 244 filters the audio signals from the BFDM signal, demodulates the FM audio signal which accompanies the video signal from the ESU 22, and provides an audio left and audio right track to the headset jack for providing to a passenger the selected audio signal via headset 250. The main board 240 provides the video signal to the VDU 14.

The telephone board 242 provides outgoing voice connection to a speaker located in the passenger seat telephone 252, incoming voice connection from a microphone located in the telephone 252, and a voice grade interface connection from a passenger modem. The telephone board 242 converts the incoming voice from the microphone or passenger modem into a digital pulse-code modulated signal in ISDN format and converts the outgoing digital pulse-code modulated signal in ISDN format into an audio signal to drive the speaker or passenger modem. The telephone board 242 also provides data exchange between the main board and the CCU 29. This is used for example to download data to the main board for use in creating a display image on the VDU 14.

The VDB 18 also interfaces with the existing mux audio distribution system in the aircraft. Passenger Service System ("PSS") functions such as attendant call, call cancel, and reading light are transmitted over the existing mux audio distribution system. Existing mux audio systems include a Seat Electronics Box ("SEB") 254 located under each seat group. The mux audio passes from the SEB 254 through the VDB 18 to the headset 250 when selected by a passenger via the PCU 16 or when in public address mode. The VDB 18 intercepts all passenger data interchange between the PCU 16 and the SEB 254. For example, a video channel change will be sent to the CCU 29 and not retransmitted to the SEB 254 while a mux audio channel change will be retransmitted to the SEB 254. For improved reliability, the PCU 16 is powered by both the VDB 18 and the SEB 254. In the event of VDB 18 power failure, the VDB 18 automatically defaults to the SEB 254, which allows for audio transmissions.

A key aspect of the present invention is removing all audio selection means such as tuners or switches from the passenger seat area. Thus, the VDB 18 merely accepts the video signal from the ESU 22 and routes it to the VDU 14. In this sense, the VDB 18 is a video slave to the head end, while the head end ESU 22 and CCU 29 are video masters to the VDB 18.

Video Display Unit

The VDB 18 outputs the video signal to the VDU 14 or Video Display Unit best seen in FIG. 1. The VDB 18 is connected to the VDU 14 through a coaxial cable. The Video Display Unit is relatively small, such as for example, a 5.6 inch video monitor. The VDU 14 preferably utilizes a color liquid crystal display ("LCD"). The passenger can control the brightness, color, and tint of the picture from the PCU 16 through the VDB 18.

The VDU 14 contains the minimal processing capability needed to allow it to interpret input commands from the VDB 18. The VDU 14 is a slave to the VDB 18 master and will either acknowledge or act upon commands from the VDB 18. For example, the VDB 18 has the capability to display text on the screen referred to as on-screen display. This includes both preprogrammed messages such as volume and channels control as well as personal text transmitted from the CSCP 42 such as messages in response to a passenger inquiry. Control over the on-screen messaging is from the VDB 18 to the VDU 14, with the VDB 18 acting as a master and the VDU 14 as slave.

Passenger Control Unit

Figure 16:
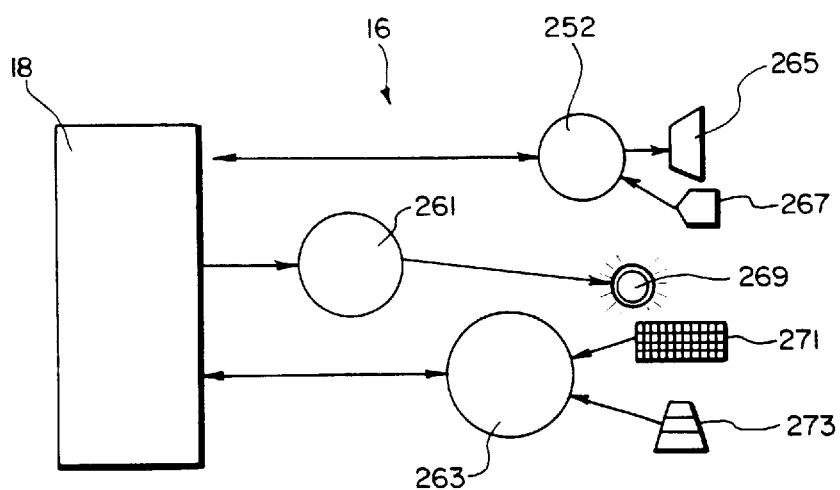
FIG. 16 is a context diagram of a passenger control unit made in accordance with the principles of the present invention.

The VDB 18 also is connected to the PCU 16 or Passenger Control Unit. A context diagram of the PCU 16 is seen in FIG. 16. The PCU 16 provides each passenger with interactive system access control. The PCU 16 provides the control for all passenger services. The PCU 16 can be tailored to the requirements of a system and the various ESes 24. The PCU 16 can be a tethered unit or can be provided built into the seatback or armrest. The PCU 16 is connected to the VDB 18 through a retracting multiwire cable. In general, the PCU 16 includes a telephone component 252, a power interface 261, and a data interface 263. The telephone component includes a speaker 265 and a microphone 267. The power interface 261 connects to indicator lights 269 which illustrate the power status of the PCU 16. The data interface connects to a keypress unit 271 and a credit card reader 273.

For example, the PCIJ 16 can include interactive controls, game controls, data entry keys, passenger service functions, and a credit card reader. The passenger service functions can include call attendant, cancel call attendant, reading light control, monitor on/off control, channel number display, audio/video/language mode, channel up/down control, brightness up/down control, and volume up/down control. The keypress unit 271 can include main menu control, previous page, right/left arrow, an A-B-C-D-E-F select keypad and a help button. The game controls can include an up/down/left/right rocker plate, and an 1-2-3-4 select keypad. The data entry keys can include an alphabetic keypad, space, return and backspace buttons, and a numeric keypad. The video control can include a play, rewind, fast forward, and pause controls.

The present invention also provides a telephone 252 at the passenger seats 12. The telephone unit 252 can be provided separately or integral with the PDU 56. The telephone buttons can include on/off, telephonic numeric keypad including # and *, volume control, new call button, send button, and a clear button. The PDU 56 can preferably include a credit card reader. The credit card reader includes a magnetic strip reader capable of reading a magnetic credit card strip. The PCU 56 defines a credit card swipe aperture through which the magnetic strip of the credit card is swiped. A green and red LED provides the card swipe status. Alternatively, a credit card reader can be built into the seatback or armrest.

Video Control Unit

Figure 17:
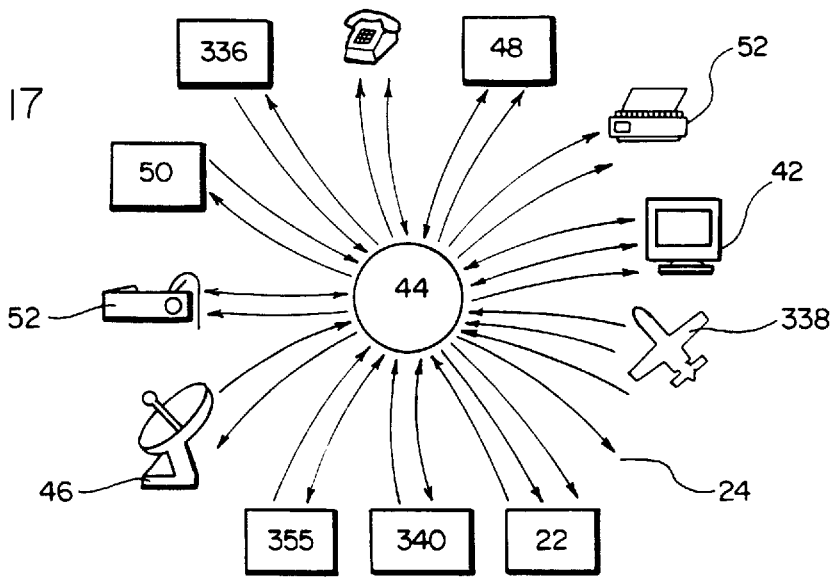
FIG. 17 is a context diagram of a video control unit made in accordance with the principles of the present invention.

Referring now to FIG. 17, the VCU 44 or video control unit is described in detail. The VCU 44 provides cabin crew members with the capability to select and monitor the video channels in the system 10 through the CSCP 42. The VCU 44 also provides a flexible data base capability for the cabin crew. Such data base capability can include for example information related to the crew, seat configurations, and passenger transaction data. This data base capability includes both data compilation and data downloading onto a permanent storage medium.

The VCU 44 receives from the ESU 22 video channels for monitoring purposes. The VCU 44 removes the frequency modulated audio components from each video channel, sending only one audio channel with the accompanying video signal to the CSCP 42.

The VCU 44 also is the depository of filing system information for the cabin crew. These functions include housekeeping functions to protect data integrity in the event of default conditions. The housekeeping functions consist of power quality management, which monitors the quality of the power while avoiding false alarms, environmental management, which provides early warning of impeding shutdown and shuts the system down prior to permanent damage created by an environmental fault, and date/time, which receives data from calendar data base in the system clock to maintain current system date and time.

The VCU 44 input/output function provides the interface between the application software and the passenger entertainment system control ("PESC") 71 and the passenger entertainment auxiliary controller ("PEAC") 69. The VCU 44 file load function enables the storage and retrieval of data to mass storage such as digital audio tapes ("DAT") 336. It also permits the maintenance crew to load new program and configuration files into the VCU 44. The file load function includes a data compress function which compresses data for tape storage, a write data conversion function which takes the compressed data and formats it for storage, the DAT data storage control function which performs the necessary electronic and electromechanical activities such as addressing required for DAT data storage and retrieval, data decompress function which receives compressed data and converts it into noncompressed data, the read data conversion function which takes decompressed data and formats it for use, and a store function which performs nonvolatile storage of programs and data in an uncompressed format.

The VCU 44 also includes keyline functions including PA detect 339, weight on wheels ("WOW") detect 338, and cabin decompression system detection 340. The PA system provides audio announcements to the passengers. Sources for the announcements include the cabin crew, flight crew, and pre-recorded announcements. Because of the potential critical nature of PA signals, hardware implementation is provided as described above. A dedicated path exists from the PEAC 69 through the CCU 29 to the VDB 18. The PEAC 69 pauses all video sources for a PA signal. This results in a paused image or pause message on the overhead video monitors 271 and VDUs 14.

When the PA signal is received at the VDB 18, the VDB 18 switches to mux audio from the SEB 254, thereby guaranteeing audio on all channels. The VDB 18 also displays "PA" on the PCU 16 channel indicator and locks out channel changes. The CCU 29 pauses all ES 24 programs to avoid missed entertainment while the PA is broadcast. In an alternative embodiment, the CCU 29 can further switch video from the video in use on the VDU 14 to an ES 24 providing passenger menus such as the MTES 32. As described in detail below, the MTES 32 provides passengers with menus. The MTES 32 also can send a "PA in progress" message to the VDB 18 for output in the VDU 14. The VCU 44 also can provide for message to be sent to the VDUs 14.

The WOW detect 338 function determines when the WOW keyline is asserted. This indicates to the system whether the aircraft is in air or on ground. Based on the in-flight condition of the aircraft, the system can determine the availability status of offered services; for example, the telephone 252 can be limited to in-flight use.

The cabin decompression system is driven if a loss of cabin pressurization occurs. The system removes power from all system components except the PEAC 69. This causes the mux audio system to be connected directly to the passenger headset 250 to ensure crew announcements are available. Certain PCU 16 functions remain available as a result of the power backup from the SEB 254. Telephone calls are immediately disconnected. The PEAC 69 immediately powers off the overhead video monitors 271. The cabin decompress detection 340 also passes the signal on to the CSCP 42 to turn off the backlight.

The VCU 44 also includes a passenger flight information system ("PFIS") 50 interface function which provides a data link between PFIS 50, such as an Airshow® unit, and the VCU 44. The Airshow® unit displays a moving map of the aircraft location along with an estimated time of arrival ("ETA") and destination weather. This data link allows the cabin crew, through the CSCP 42, to control the PFIS unit 50.

The VCU 44 also can alternatively include an aircraft communications addressing and reporting system ("ACARS") 48 interface function. The ACARS 48 allows cabin crews to send and receive text messages on the ground or in flight. The ACARS 48 interfacing function provides a link between the aircraft ACARS 48 unit and the VCU 44. The ACARS 48 sends and receives data from the air to ground telecommunications links such as the SDU 46.

The VCU 44 also includes a satellite communications interface function. The satellite communications interface function provides a data link between the SDU 46 and the VCU 44. The satellite communications interface function is in parallel to the ACARS 48, but provides a direct link to the air-to-ground telecommunications link. Typical air-to-ground messages include for example maintenance data download, catering inventory data, or passenger assistance requests. The SDU 46 provides an air-to-satellite link which is then linked from satellite to ground to complete the air-to-ground communication. It will be understood that the SDU is not the only means by that the system can communicate with the ground.

Finally, the VCU 44 includes auxiliary function control such as the external VCU 44 small computer systems interface ("SCSI") function which performs interface functions between peripherals connected to the VCU 44 external SCSI ports and other serial functions which are adaptable for customer specific functions on enhanced systems.

Cabin System Control Panel

Figure 18:
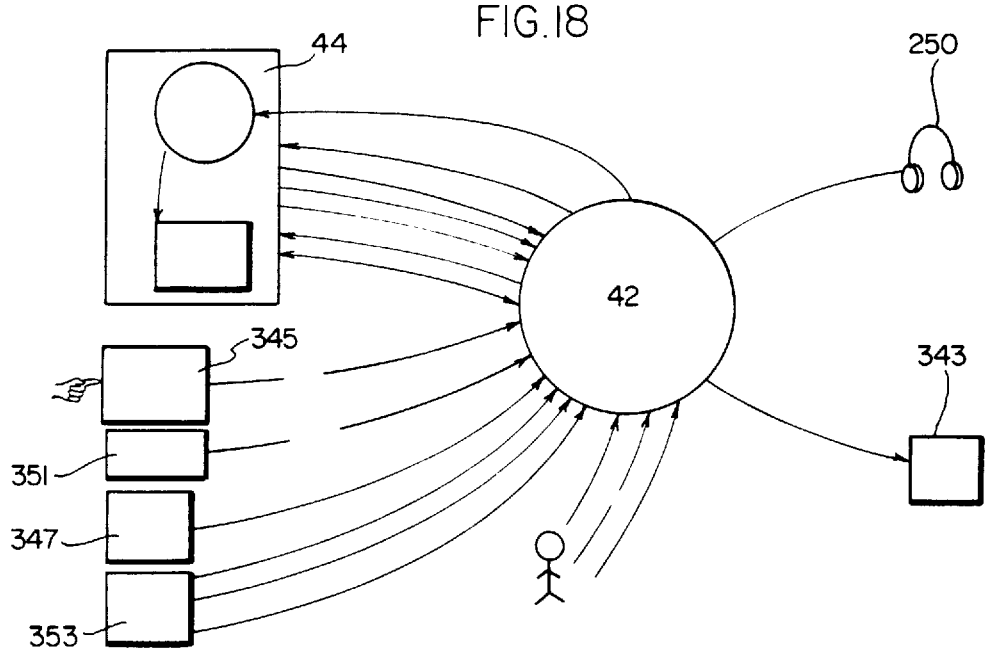
FIG. 18 is a context diagram of a cabin system control panel made in accordance with the principles of the present invention.

Referring now to FIG. 18, the CSCP 42 or cabin system control panel is described in detail. The CSCP 42 provides the cabin crew with an interface to the VCU 44. The CSCP 42 consist of a full color, active LCD module 345 with an integrated screen backlight, touch screen 345, floppy disk drive 347, and a power supply 349. The CSCP 42 also provides ports for preview audio, a standard keyboard 351, a credit card reader 353, and a serial input/output connection 355 which permits the VCU 44 to remotely use the CSCP 42 floppy disk drive 347.

The CSCP 42 provides cabin crew interface for the VCU 44. The VCU 44 provides interface and control to peripherals such as PFIS 50, point of sale terminals 357, and printers 52 such as credit card receipt printers 52 and the main cabin printer. Through the CSCP 42 and the VCU 44, the cabin crew can control the operating modes of the system, such as control and monitoring of the video sources and overhead video monitors 271.

To achieve data entry, the CSCP 42 includes touch screen input processing which develops the X-Y coordinates from the touch screen and submits the coordinates to the VCU 44. Data from the CSCP floppy disk drive 347 can be accessed by the VCU 44 via a file data buffer function included in the CSCP 42. The CSCP 42 has a bidirectional interface with the VCU 44. To alternatively achieve data entry, the CSCP 42 includes a keyboard input connect which receives data from a standard keyboard 351, translates it and sends it to the VCU 44. The keyboard 351 preferably includes an integral keyboard credit card reader function.

The CSCP 42 touch screen device driver 245 is resident in the VCU 44. The CSCP 42 touch screen device driver 245 interfaces with the CSCP 42 via a windowing operating system on the VCU 44. The touch screen data received from the CSCP 42 is converted to standard mouse messages for the operating system which are sent to the VCU 44 application function.

The CSCP 42 further includes a LCD driver which receives the video signals from the VCU 44 and drives the LCD output to display video for monitoring purposes.

Passenger Entertainment Auxiliary Controller

The PEAC 69 or passenger entertainment auxiliary controller receives broadcast video programs such as panoramic camera, VTRs and the PFIS 50 and converts these signals into BFDM format. The PEAC 69 allows assignment of any broadcast video source such as the VTRs or any other source such as VOD 34 to the overhead video system and the VDU 14. The PEAC 69 passes VTRs to the overhead video for VA. The PEAC 69 accepts commands and status from the VCU 44 via a serial interface. The PEAC 69 provides preprocessing functions for the ESU 22 and control over the overhead video system. Inputs are processed and formatted and then routed to the ESU 22 and overhead video system. The PEAC 69 includes a control module and a demodulation module. The control module controls and coordinates the modular functions of the PEAC 69. The control module interprets commands received from the VCU 44 and issues commands for the voice activated and public address keyline process logic, VTRs, and the ESU 22 demodulators. The demodulation module is used to provide separation of BFDM inputs into their audio and video components for output of only one of the four audio channels to the mux audio system and the video signal to the overhead video system.

Entertainment Servers

The ES 24 or entertainment servers include several types of head-end sources. Examples include video on demand ("VOD") 34, video game entertainment server 36, such as the Super Nintendo Entertainment Service ("SNES") 38, personal computer applications and games ("PCES") 40, and multi-tasking entertainment system ("MTES") 32. The typical server contains multiple individual, independent hardware/software platforms to support the applications, as well as a mass storage disk drive unit that stores the data required for the application. A controller on each server receives requests for resources, allocates a platform to the request, and loads the application from the disk to the processor platform. During execution of the application, the controller handles data between the passenger and the application, such as keypress inputs from the passenger. The controller in each server services the collective needs of all the individual platforms. Each platform within the server outputs BFDM signals.

Multi-Tasking Entertainment Server

The MTES 32 or multi-asking entertainment server provides passengers with initial menus and transactional applications such as shopping an board, airline reservations, lodging reservations, and ground transport. As with the other ESes 24, the MTES 32 can be connected to the VDB 18 through the ESU 22, as depicted in FIG. 2. In the preferred embodiment, the MTES 32 can be located between the ESU 22 and the VDB 18. In this location the MTES 32 operates in an interactive menu mode and in an interactive video mode. In the interactive menu mode, the MTES 32 receives keypress inputs from the passenger via the CCU 29 and outputs to the VDB 18 NTSC video. In the interactive video mode, the MTES 32 can pass the BFDM signal from the ESU 22 to the VDB 18. Placing the MTES 32 on its output side frees ESU 22 and CCU 29 paths to increase server availability and increases the ease and speed of providing the passenger with an initial menu.

The MTES 32 is capable of generating static video display data signals. These signals can be configured to respond to signals from the passenger. The MTES 32 generally includes a data storage device that stores the series of static video display data signals. In an alternative embodiment of the invention, any other data storage device within the system can store the series of static video displays required by the MTES 32.

In general, the series of static video display data are understood to be commonly used menus which respond to signal activities from the passenger seats 12. Each menu is matched with a series of other menus and the passenger seat can select any one of the matched menus and proceed through the entire series of menus. When the MTES 32 is selected as the desired head end source by the passenger seat, the processor of the system generates NTSC video signals that encompass the menu screens and the signals are sent over the system.

The MTES 32 includes a frame buffer and a NTSC output board. The frame buffer and the output board generate the video static screens that include the menus which are sent to the passenger seat. In addition, the frame buffer and the output board accept the keypresses from the passenger seats 12 so that the they can proceed through the series of matched menus. In addition, the MTES 32 includes an interface adapter board which operates as the interface between the ES 24 and the CCU 29. In the preferred embodiment, the interface adapter uses ethernet communications.

During normal operations, the MTES 32 responds to messages it receives by accessing menus from the data storage device. In response, the MTES 32 generates NTSC video signals to send to the passenger seat for another response.

Video on Demand

Figure 19:
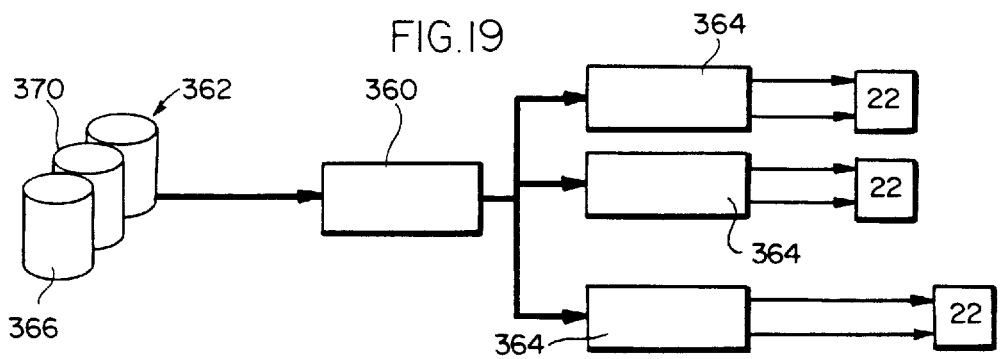
FIG. 19 is a schematic of a video on demand made in accordance with the principles of the present invention.

FIGS. 19 and 20 illustrate the VOD 34, or video on demand, that provides passengers with a selection of films or video programs to watch at the passenger's convenience. Passengers can individually pause, play, stop, rewind or fast forward the program using the controls on the PCU 16. Numerous passenger seats 12 can simultaneously access the same video and each passenger can individually control that passenger's viewing of the same video while other passengers simultaneously view and individually control their viewing of the same video. Another feature is that multiple passenger seats 12 can connect to different videos and each passenger seat can individually control that passenger's viewing of the selected video. The passenger views VOD 34 program selections from an application on a menuing platform. After the passenger requests the desired program with the PCU 16, the CCU 29 initiates a request for a VOD 34 resource. The VOD 34 also can support broadcast programs via the PEAC 69. Broadcast program are not controlled by the passengers but rather by the cabin crew via the CSCP 42.

The VOD 34 includes a controller 360, video data 362, and a decoder 364. The VOD controller 360 receives a request and responds with resource availability. If and when a resource is available, the CCU 29 routes the VOD 34 video data 362 to the passenger by controlling switches in the ESU 22. Assigned VOD 34 channels also are routed to the CSCP 42 via the VCU 44 to allow the cabin crew to monitor VOD 34 quality. The CCU 29 also directs applicable PCU 16 keypresses entered by the passenger to the VOD 34 controller. The VOD video data 362 is feed to a VOD decoder 364, which expands the compressed data and converts it to a BFDM signal for output to the passenger. Each VOD decoder 364 contains a number of independent decoder 364 and service data streams for a number of passengers.

The VOD 34 programs are stored on magnetic hard disk drives 366 in the VOD file server. The DAT drive 366 on the VCU 44 which is used to enable the storage and retrieval of data from the VCU 44 to DAT 366 also can be used to down load the programs to the disk drives 366 in the VOD 34 subsystem. An optional VOD 34 downloader can be used to reduce the time required for download. The maintenance crew initiates the download process by using the CSCP 42 interface.

An audio on demand ("AOD") subsystem also can be provided. The AOD subsystem operates in the same manner as VOD 34. Passengers select from a library of audio programs stored in a AOD file server and can fully control the selected audio from the PCU 16.

In the preferred embodiment seen in FIG. 19, the VOD 34 file server sustains transfer rates of a minimum 25.6 MB/sec. In order to provide such transfer rates and to be capable of providing the multiple connections to the passenger seats 12, the VOD 34 uses a redundant array of independent disk array architecture. This architecture facilitates the required high data availability through its redundancy and high data bandwidth. The redundancy of the disk arrays also insures that there are adequate resources in the system for numerous passenger seats 12 to access the sam source.

The redundant array of independent disks includes a high speed Motion Pictures Experts Group ("MPEG") video file storage system. As can be seen in FIG. 20, the file is generally understood to be a parallel array of disk drives 370, each storing a variety of video sources. In the preferred embodiment, an individual disk array is provided with eight high speed SCSI data hard drives 372 and a ninth high speed SCSI hard drive 372 to maintain the required parity within the system.

Multiple disk arrays also can be provided. In this embodiment, eight disk arrays are provided where the first disk array serves as the master disk array and the remaining disk arrays serve as satellite disk arrays. This configuration provides the desired high throughput of the VOD 34 server. In the event that there is a need or desire to provide additional storage capacity, an addition disk array can be provided without changing the data throughput. Each satellite disk array contains another nine SCSI hard drives as described above. In the preferred embodiment each SCSI disk drive has a capacity of 4.295 GB so that each array has a capacity of 32.56 GB sustaining a throughput of 27 MB/sec. Thus, a VOD file server comprised of eight disk arrays has a capacity of 240.5 GB, or approximately 332 hours of MPEG programming for use by the passenger seats 12.

The controller includes a level 1 VME CPU 374 and two level 2 VME controllers 376. The VOD 34 file server has two interfaces, a first interface 378 which connects to the file server controller resident on the level 1 VME CPU 374 and a high speed interface 382 that connects to the level 2 VME controllers 376. In turn, the level 1 VME CPU 374 connects to the CCU 29 through an ethernet interface and the level 2 VME controller 376 connects to a series of decoder arrays 364. As will be explained below, the decoder arrays 364 send the video signals to the passenger seats 12.

In one embodiment of the present invention, the first interface is a SCS1-2 interface 378 and is used to pass file requests from the controller 380 to the disk array and to return status messages to the controller. The controller 380 generates file requests for MPEG data packets and responds to status messages from the disk array. The packets contain a series of data from the disk array for use by the file server controller.

In the same embodiment, the high speed interface is a QuickRing 382 interface which is preferably a National Semiconductor chip set. The interface 382 provides point to point communication between the file server and the file server controller 384 at peak rates of 200 MB/sec for an aggregate ring rate of 1.6 GB for the eight disk arrays. The QuickRing interface 382 is used to send requested MPEG data packets to the file server controller 384, described below. The QuickRing interface 382 is made of QR0001 controllers having a reduced clock rate of 33 MHz thereby allowing peak point to point data rates of 132 MB/sec.

MPEG data packets transferred over the high speed interface 382 are preceded by a header that indicates the destination, i.e. passenger seat, and attributes of the datastream. Each subsequent data transfer following the header is part of the same datastream to the same passenger seat until another destination header is written. For the receiving end, the datastream contains a header indicating the source and the attributes of the stream.

In the preferred embodiment, the controller of the VOD 34 includes a central processor that provides command decoding capability for the ES 24. Accordingly, the VOD 34 can understand the commands received by the system. Once the commands are decoded, the central processor distributes the commands to the appropriate location within the ES 24. The central processor also maintains the subsystem configuration of the system as well as the programmable information. It collects status reports, directs data and manages the synchronization of the data sequencer and the disk controller.

A sequence module can also be provided which generates one parity word for each sequential pass through the disk drives. In addition, the sequence module provides the high-speed state machine logic required by the ES 24. It also provides the control of time-division-multiplexed bus interface to the disk controller. The sequence module is capable of sustaining 35 MB/sec for the entire capacity of the system.

The disk controller of the level 1 CPU is controlled by the central processor. The data controller controls the SCSI drive and the buffering for the server, and it provides communications with a sequencer module. In the event of a detected error by the disk controller, the sequence module logic will use the parity data from the disk controller and with the data from the non-failed channels and reconstruct the datastream.

As seen in FIG. 21, the decoder array 364 takes the MPEG data packets from the file controller 384 and sends the data in a BFDM signal to the passenger seats 12. The decoder array 364 decodes the datastreams from the file controller and plays out video synchronized with audio. In the preferred embodiment, the decoder array includes a level 3 Nitro CPU Board 390, a Quad MPEG Decoder Card 391, and a Quad Modulator Card 394. The level 3 Nitro CPU Board 390 receives MPEG data packets from the QuickRing bus 382 of the VOD 34 server. The MPEG data packets contain commands, decoder addresses and packet numbers which are loaded the targeted decoder's memory space. A level 2 Nitro 40 CPU 392 makes data requests to the VOD 34 file server over its interface in response to the decoder data requests received from the level 3 Nitro CPU Board 390. If the decoder detects a change in status the level 3 Nitro CPU Board 390 writes a new command into the level 2 Nitro 40 CPU 392 and the decoder response to the command. The Quad Modulator Card 394 generates the BFDM signal.

The VOD 34 can be configured with an internal monitor to provide direct access to the disk arrays. This internal monitor can be accessed by connecting a computer and keyboard to a designated RS232 port provided on the ES 24. When the computer and keyboard are connected to the server it has the ability to configure the server to its required format, format each of the disk drives, reconstruct the disk drives as required, display error statistics recording the server, clear the error statistics once the errors have been displayed and corrected, provide a spin drive up and down, display the configuration of the system and reset the system as required.

Personal Computer Entertainment Server

FIG. 21 illustrates the PCES 40 or personal computer entertainment server that provides passengers with a PC based platform to run PC applications. The PCES 40 enables passengers to select from a multitude of PC based application software in categories such as games and entertainment, office automation, and education.

The PCES 40 provides the passenger seats 12 with the video displays for non-game entertainment server video games, PC functions for the system. The PCES 40 consists of a VME CPU board 401 with an ethernet bus 227. The ethernet bus 227 is to communicate with the ESU 22 and the CCU 29. In the preferred embodiment, the CPU board 401 is a 60804 Motorola microprocessor.

In addition, the PCES 40 consists of a number of VME PCs 405 which have the function of four personal computers. In the preferred embodiment, the VME PC boards 405 have enough PC assemblies to function as 48 different PCs. The PC assemblies can use 486 processors or any other type of processor.

For the PCES, one SCSI hard drive 407 is provided which serves the CPU and the various PC assemblies. On the hard drive 407, the system and application software is stored. In addition, the hard drive is configured into virtual partitions 409 so that each PC assembly sees its own hard drive.

The PCES 40 receive keypress data from the passenger seat through the ethernet bus 227 from the CCU 29. The keypress data is translated by the CPU board 401 into keystrokes recognized by the applications running on the PC board. In response to the keypress information received by the PC assemblies, the PCES 40 translates the information from the PC assemblies into BFDM signals to be sent to the passenger seat.

The PCES 40 can be configured so that a single passenger can connect to a single PC and interact with that PC, or it can be configured so that two or more passenger seats 12 can connect with the same PC so that the two passenger seats 12 can interact with the same PC and with the other passenger seat.

Game Entertainment Server

FIG. 22 illustrates the GES 36 or Game Entertainment Server that provides a series of GES 36 game modules to provide video game software to the passengers. Within the GES 36, the video game signal is converted to a BFDM signal. The passenger interactively controls the GES 36 game through the PCU 16.

The GES 36 can be configured so that a single passenger can connect to a single game on the game source and interact with that selected single game, or it can be configured so that two or more passenger seats 12 can connect with the same single game source so that the two passenger seats 12 can interact with the same game source and with the other passenger seat.

The GES 36 of the present invention preferably contemplates use of more than one type of game system including for example Super Nintendo and Sega. Each of these system operate in different ways and require different hardware and software. In order to support multiple types of different games, the GES 36 provides various types of platforms and devices. In the preferred embodiment described herein, the platform is a Super Nintendo platform, and it will be understood that the following discussion will apply to they other types of game platforms available.

The GES 36 contains the necessary game hardware 420 and software to perform the games. Each game producer has its own platform which may not be compatible with other platforms. A processor 423 on the GES 36 provides the central control for the Super Nintendo, or other game hardware 420 that is provided as a part of the GES 36. Typically, the game hardware 420 requires a game cartridge to supply the game software that produces the game on the video display unit. However, the system does not use game cartridges 36, but rather stores the series of games on the data storage device 422. In this situation, the game hardware 420 requires some sort of a emulation device 424 so that the game hardware 420 sees the game cartridge from the data storage device 422.

The GES 36 receives game requests and key press data from the passenger seats 12 through the CCU 29 and in response to these requests the platform sends game video and modulated game audio signals through the ESU 22 to the passenger seats 12. The GES 36 also includes a processor 423 to interpret control signals sent from the passenger seats 12 to the game server.

The GES 36 uses a PCB VME board 426 with an emulation read only memory ("ROM") and a host bus interface to serve as the emulation device. The emulation ROM includes a random access memory ("RAM") so that the emulation device looks like a game cartridge to the game hardware. The host bus interface and the Super Nintendo hardware share a bi-directional data path for interactive application communications when the game hardware is running game programs from data storage device. Both the host bus interface and the game hardware share the emulation ROM and RAM to run the game programs.

The GES 36 also includes a game hardware VME board 426 which proves host functions required by the game board. The VME board should be completely compatible with the interface requirements of the game board. The emulation device and the VME board are a part of the VME game hardware 420 of the game server. This assembly provides execution of the Super Nintendo applications and receives the key press information from the CCU 29.

In addition, the host bus interface serves as supervisory control over the game hardware. The interface is responsible for passing game controller data to the game hardware so the hardware sees the game cartridge and operates as if the game cartridge were actually there. The host bus interface also is responsible for downloading the application code and data from the data storage device to the game hardware. Accordingly, the host bus interface must respond to interactive application requests from the game hardware for the code and data resources stored on the data storage device.

Of course, various changes and modifications to the preferred and alternative embodiments described herein will be apparent to one skilled in the art. For example, a five stage switch can be configured utilizing the principles of the present invention or the video two switch can be comprised of a three stage switch. Additional multi-staged switches can be configured also utilizing the principles of the present invention. Such changes and modifications can be made without departing form the spirit and scope of the invention and without diminishing its attendant advantages. It is therefore intended that such changes and modifications be covered by the appended claims.

What is claimed is:

1. A switching unit comprising:

input means for receiving a plurality of information signals wherein the input means includes circuit boards having multiple layers to receive analog and digital information signals and multiple input switches;

output means for distributing a plurality of the information signals wherein the output means includes multiple output switches;

crosspoint means for establishing a plurality of paths between the input means and the output means wherein the crosspoint means includes multiple crosspoint switches; and routing means for selecting a path between the input means and the output means through the crosspoint means, the routing means including means for reallocating existing paths by examining paths previously selected by the routing means and a new paths for the reallocation of paths from the input means, through the crosspoint means and to the output means to thereby overcome blocking of the new path between the input means and the output means and optimize the paths through the crosspoint means wherein the reallocation means partitions the existing paths and the new path into at least a first and second matching wherein first matching contains connections between the input switches and the output switches not common to connections between the input switches and the output switches in the second matching and deallocates the existing paths and reallocates the connections of the first matching to paths through one crosspoint switch and the connection of the second matching to paths through another crosspoint switch.

2. The switching unit of claim 1 wherein the input means, the crosspoint means and the output means are each printed circuit boards and wherein the crosspoint board is orthogonal to the input board and the output board is orthogonal to the crosspoint board.

3. The switching unit of claim 2 further comprising a video back plane printed circuit board having connections for the input board to mount orthogonal to the crosspoint board and for the output board to mount orthogonal to the crosspoint board.

4. The switching unit of claim 2 wherein the printed circuit boards are multilayered.

5. The switching unit of claim 2 wherein the printed circuit boards include integrated circuits to switch information signals between the input means and the output means.

6. The switching unit of claim 1 wherein the input means comprises at least one crosspoint switch.

7. The switching unit of claim 1 wherein the output means comprises at least one crosspoint switch.

8. The switching unit of claim 1 wherein the crosspoint means comprises at least one crosspoint switch.

9. The switching unit of claim 1 wherein the routing means comprises:

computing means for establishing the paths; and memory means for storing a map of the established paths.

10. The switching unit of claim 1 wherein the reallocation means examines each path previously established by the routing means at most once to establish a new path.

11. The switching unit of claim 1 wherein the reallocation means examines each output means at most once to establish a new path.

12. The switching unit of claim 1 wherein the reallocation means includes a packing means for finding the optimum paths through the crosspoint means.

13. The switching unit of claim 1 further comprising a second input means for receiving a plurality of information signals.

14. The switching unit of claim 13 wherein the input means receives non-broadcast information signals and the second input means receives broadcast information signals.

15. The switching unit of claim 13 wherein the input means, the crosspoint means, the second input means and the output means are each printed circuit boards and wherein the crosspoint board is orthogonal to the input board and the output board is orthogonal to the crosspoint board.

16. A switching unit comprising:

input means for receiving a plurality of information signals wherein the input means includes circuit boards having layers to receive analog and digital signals and a differential receiver circuit to convert information signals into single ended signals for distribution through the switching unit, output means for distributing a plurality of the information signals;

crosspoint means for establishing a plurality of paths between the input means and the output means, and routing means for selecting a path between the input means and the output means through the crosspoint mean, the routing means including means for reallocating existing paths by examining paths previously selected by the routing means and a new path for reallocation of paths from the input means, through the crosspoint means and to the output means to thereby overcome blocking of the new path.

* * * * *

UNITED STATES PATENT AND TRADEMARK OFFICE
CERTIFICATE OF CORRECTION

PATENT NO. : 5,889,775

DATED : March 30, 1999

INVENTOR(S) : Sawicz et al.

It is certified that error appears in the above-identified patent and that said Letters Patent is hereby corrected as shown below:

Column 5, Line 59, delete "("LRUsI")", and substitute --("LRUs")-- therefor;
Column 5, Line 60, delete "ILRU" and substitute --LRU-- therefor;
Column 9, Line 36, delete "143" therefor;
Column 17, Line 36, delete "PCIJ" and substitute --PCU-- therefor;
Column 23, Line 23, delete "SCS1-2" and substitute --SCSI-2-- therefor.

Signed and Sealed this

Seventh Day of September, 1999

Attest:

Q. TODD DICKINSON

*Attesting Officer*  *Acting Commissioner of Patents and Trademarks*